(12) United States Patent
Yau et al.

(10) Patent No.: US 10,957,707 B2
(45) Date of Patent: Mar. 23, 2021

(54) VERTICAL TRANSISTOR BASED RADIATION DOSIMETER

(71) Applicant: International Business Machines Corporation, Armonk, NY (US)

(72) Inventors: Jeng-Bang Yau, Yorktown Heights, NY (US); Alexander Reznicek, Troy, NY (US); Bahman Hekmatshoartabari, White Plains, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/391,982

(22) Filed: Apr. 23, 2019

(65) Prior Publication Data

US 2020/0343257 A1    Oct. 29, 2020

(51) Int. Cl.
*H01L 27/11582* (2017.01)
*H01L 27/11565* (2017.01)
*H01L 29/786* (2006.01)
*G01T 1/02* (2006.01)
*H01L 27/11573* (2017.01)

(52) U.S. Cl.
CPC ......... *H01L 27/11582* (2013.01); *G01T 1/02* (2013.01); *H01L 27/11565* (2013.01); *H01L 27/11573* (2013.01); *H01L 29/78603* (2013.01); *H01L 29/78645* (2013.01)

(58) Field of Classification Search
CPC ......... H01L 27/11582; H01L 27/11565; H01L 27/11573; H01L 29/78603; H01L 29/78645
See application file for complete search history.

(56) References Cited

U.S. PATENT DOCUMENTS

| 7,432,539 | B2  | 10/2008  | Taylor |
| 7,936,270 | B2  | 5/2011   | Britton, Jr. et al. |
| 9,040,343 | B2  | 5/2015   | Enomoto et al. |
| 9,397,002 | B1* | 7/2016   | Belyansky .......... H01L 29/7851 |
| 9,461,080 | B2  | 10/2016  | Masuda |
| 9,525,064 | B1* | 12/2016  | Balakrishnan ...... H01L 29/0847 |

(Continued)

FOREIGN PATENT DOCUMENTS

WO    WO2004/099740    11/2004

OTHER PUBLICATIONS

Jeng-Bang Yau, et al.: FDSOI Radiation Dosimeters, IBM T.J. Watson Research Center, Yorktown Heights, NY 10598, USA 2; Department of Electrical and Computer Engineering, University of Minnesota, Minneapolis, MN 55455; IBM Semiconductor Research and Development Center, Hopewell Junction, NY 12533, USA.

(Continued)

*Primary Examiner* — Herve-Louis Y Assouman
(74) *Attorney, Agent, or Firm* — Daniel P. Morris; Lou Percello, Attorney, PLLC

(57) ABSTRACT

The dosimeter has two vertical field effect transistors (VFETs), each VFET with a bottom and top source/drain and channel between them. An implanted charge storage region material lies between and in contact with each of the vertical channels. A trapped charge is within the implanted charge storage region. The amount of the trapped charge is related to an amount of radiation that passes through the implanted charge storage region.

20 Claims, 22 Drawing Sheets

(56) References Cited

U.S. PATENT DOCUMENTS

| | | | |
|---|---|---|---|
| 9,806,173 B2 | 10/2017 | Balakrishnan et al. | |
| 9,985,073 B2 | 5/2018 | Kasai | |
| 2006/0220102 A1* | 10/2006 | Mathew | H01L 29/40114 257/316 |
| 2007/0257275 A1 | 11/2007 | Taylor | |
| 2011/0303972 A1* | 12/2011 | Saitoh | H01L 27/11582 257/329 |
| 2014/0080252 A1 | 3/2014 | Togashi et al. | |
| 2018/0006181 A1* | 1/2018 | Cheng | H01L 31/18 |

OTHER PUBLICATIONS

R. L. Pfeffer, "Damage center formation in SiO2 thin films by fast electron irradiation"; Journal of Applied Physics 57, 5176 (1985); https://doi.org/10.1063/1.335252; Submitted: Oct. 26, 1984 . Accepted: Feb. 7, 1985 . Published Online: Jun. 4, 1998.

R. A. B. Devine, "Oxygen vacancy creation in SiO2 through ionization energy deposition," Appl. Phys. Lett. 43, 1056 (1983); https://doi.org/10.1063/1.94234, Submitted: Jul. 11, 1983 . Accepted: Sep. 16, 1983 . Published Online: Jun. 4, 1998

R.A. B. Devine and A. Golanski, "Creation and annealing kinetics of magnetic oxygen vacancy centers in SiO2," Journal of Applied Physics 54, 3833 (1893); https://doi.org/10.1063/1.332531, Submitted: Dec. 17, 1982 . Accepted: Feb. 25, 1983 . Published Online: Jun. 4, 1998.

\* cited by examiner

US 10,957,707 B2

VERTICAL TRANSISTOR BASED RADIATION DOSIMETER

BACKGROUND

The present invention relates to a semiconductor radiation monitor (e.g. a dosimeter.) More specifically, to a radiation dosimeter embodied using vertical transistor structures.

Radiation may come in various forms, including, for example, as X-rays, alpha particles, protons, gamma rays, or beta-rays. There are various types of radiation monitors that may be used to determine an amount of radiation exposure, such as ionization detectors, Geiger counters, and thermoluminescent detectors (TLDs). Geiger counters and ionization detectors may determine and display a dose rate (for example, in mRad/hr) or an integrated dose (for example, in Rads) of radiation exposure accumulated over a time period. Alarm set points may be programmed based on the dose rate and/or the integrated dose. A Geiger counter or ionization detector may communicate with a computer for data logging or firmware updates.

However, Geiger counters and ionization detectors may be relatively expensive. TLDs allow determination of a dose of radiation based on emission of photons in response to application of heat. TLDs may be relatively inexpensive but may only read integrated dose after a period of exposure time, typically between one and three months. A degree of radiation exposure may only be determined after-the-fact using a TLD; real time dose information is not available.

One type of semiconductor radiation monitoring device may include a p-channel metal-oxide-semiconductor field effect transistor (MOSFET) transistor structure having a gate oxide layer fabricated on bulk silicon. Ionizing radiation induces holes in the gate oxide layer of the FET structure. The holes are trapped in the gate oxide by a voltage applied to the gate. The threshold voltage (Vth) of the transistor may change in relation to the amount holes that are trapped. Therefore, the amount of ionizing radiation is related to the shift in threshold voltage (Vth).

However, in order to measure the change in Vth of the MOSFET described above, a negative voltage is applied to the MOSFET gate, which may trigger the release of the holes trapped in the gate oxide via direct or trap-assisted tunneling. Therefore, electrical readout of the Vth shift to determine the radiation dose in such a FET-type dosimeter may cause a loss of the radiation-induced charge, leading to incorrect long-term total dose data. Further, the trapping voltage and the readout voltage are both applied at the gate, they may not be applied at the same time, so real-time information regarding a dose of radiation may not be obtained.

Another type of semiconductor radiation monitoring device includes a fully depleted semiconductor-on-insulator (FDSOI) dosimeter. One example of an FDSOI dosimeter includes a buried insulator layer disposed on a semiconductor substrate. The buried insulator layer includes a plurality of charge traps. A semiconductor layer is disposed on the buried insulating layer. A second insulator layer is disposed on the semiconductor layer. A gate conducting layer is disposed on the second insulator layer, and one or more side contacts are electrically connected to the semiconductor layer. A back contact is electrically connected to the semiconductor substrate, the back contact is configured to receive a backgate voltage during a radiation exposure by the radiation monitor to enhance trapping of charges generated by the radiation. The backgate voltage includes a positive bias across the buried insulator layer that is configured to trap an amount of positive charge in the charge traps in the buried insulator layer in response to the radiation exposure by the radiation monitor, wherein the amount of positive charge trapped in the charge traps in the buried insulator layer is used to determine the amount of the radiation exposure. The FDSOI dosimeter is capable of real time readout, with retention, but is limited in density due to its planar structure and detection of lower dose (equal to, or lesser than, 100 rad) at the expense of larger device area.

SUMMARY

Disclosed are preferred embodiments of novel semiconductor dosimeter including methods of making these dosimeter devices and structures.

The dosimeter has two vertical field effect transistors (VFETs), each VFET has a bottom first-type doped source/drain, a top first-type doped source/drain, and an undoped channel between each bottom and top first-type doped source/drains. An implanted charge storage region material lies between and in contact with each of the vertical channels and is in physical contact with a charge storage side of the respective channel. (The charge storage sides of the channels are opposed in orientation to one another across the implanted charge storage region.) A trapped charge is within the implanted charge storage region, particularly along the charge storage sides. The amount of the trapped charge is related to an amount of radiation that passes through the implanted charge storage region, in addition to the amount of charge trapped caused by the implantation. The implanted charge storage region has a thickness dimension along the respective channel and an inter-channel (or inter-trench) distance between the channels. A bottom spacer layer electrically insulates the implanted charge storage region from the bottom first-type doped source/drain and a top spacer layer electrically insulates the implanted charge storage region from the top first-type doped/source drain.

A gate dielectric material is disposed on each of the channels on a gate channel side, the gate channel side is opposite the charge storage side on the channel. External electrical contacts are made to the source/drain layers and the gate. In preferred embodiments, the charged oxide is between the two VTFET between the charge storage sides of the channels and the gate interfaces the channels on a gate side of the channels (the gate side of the channel being across the channel from the charge storage side of the channels.) In preferred embodiments, work function metals of both gates are electrically connected and surround both of the channels around the gate side of the channels with charge oxide being between the charge side of the channels.

The amount of trapped charge creates an electric field in each of the channels that varies a threshold voltage of current flow through the channels between the bottom and top first-type doped source/drains of each of the VFETs. The threshold voltage is related to the amount of radiation passing through the implanted charge storage region.

DETAILED DESCRIPTION

Figure 1:
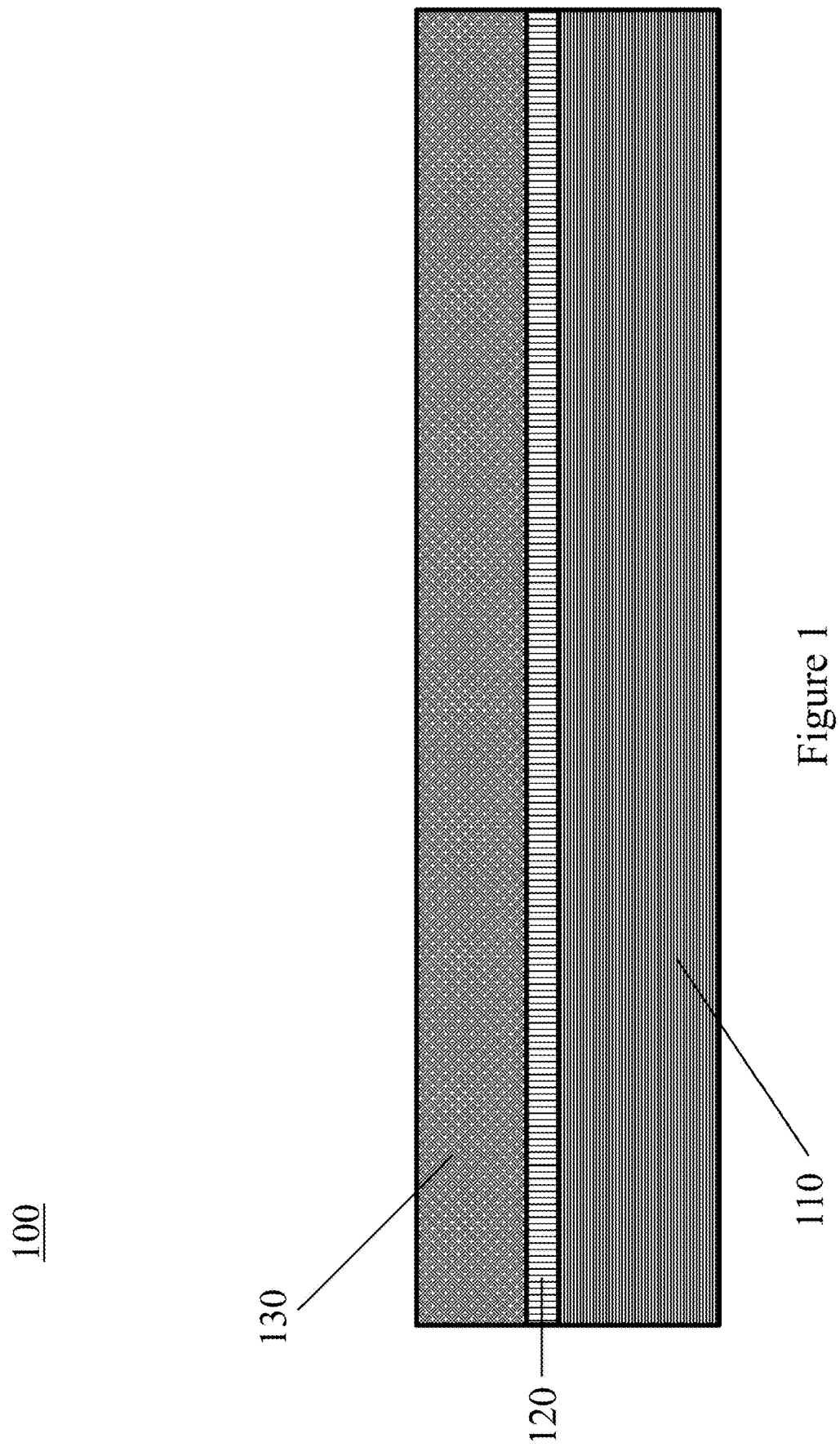
FIG. 1 is a cross-section of an initial structure with a substrate bulk layer, a counter-doped layer, and a first-type doped layer (e.g., an n-doped source.)

Vertical transistors are an attractive option for technology scaling for 5 nm and beyond. One difficult challenge to overcome for vertical transistors are the variation in gate length, spacer thickness, and extension doping profile due to the integration challenges posed by vertical orientation of the transistor. Disclosed is a channel-last replacement metal-gate gate all-around vertical transistor with a pre-defined gate length and spacer thickness. These features are well-controlled because their fabrication does not depend on etch or CMP processes.

The invention uses a hole trapping mechanism in an oxide region to bias the channel region of two vertical field effect transistors (VFET.) Electron-hole pairs are created by ionizing radiation. The holes become trapped in an oxide region that is proximate to the channels of the two VFETs. As the electrons created in the hole-electron pairs quickly dissipate (e.g. in nanoseconds), the holes will be trapped inside of the oxide. These trapped holes will cause a shift in the VFET threshold voltage, Vth. The Vth can be measured, e.g. by comparing the change in gate voltage required to maintain the same drain current before irradiation. By knowing the relationship between the amount of ionizing radiation and one or more of these parameters of the VFET, circuitry can be designed and used with the VFET to measure the amount of ionizing radiation.

Using the novel process steps to create novel VFET radiation dosimeters greatly increases the number of devices per area, e.g. device density, that can be made on a substrate. This results in lower fabrication cost per device. In addition, the novel process disclosed uses standard CMOS-compatible processes and VFET chemistries and does not require more expensive materials, e.g. silicon on insulator (SOI) substrates.

The present dosimeter is more sensitive than those devices in the prior art. The novel design enables detection and measurement of lower radiation doses, e.g. ≤100 rad, by implementing one or more of the following non-limiting design features:

precise implantation into an oxide to create more hole traps in an implanted charge collection region;

precise control over the aspect ratio of the implanted charge collection region;

precise control of channel lengths, uniformity of the widths of the channels, and control of spacer thickness;

location of the charge collection region between 2 channels to increase the signal output; and minimized damage to dosimeter components during manufacture.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

FIG. 1 is a cross-section of an initial form "blanket" structure with a bulk layer, a counter-doped layer, and a first-type doped layer (e.g., an n-doped source.)

FIG. 1 is a cross-section 100 of an initial form "blanket" structure with a bulk or substrate layer 110, a counter-doped layer 120 disposed on the bulk layer 110, and a first-type doped layer (e.g., an n-doped source) 130 disposed on the counter-doped layer 120.

The substrate/bulk 110 is made of one or more semiconductor materials. Non-limiting examples of suitable substrate/bulk 110 materials include Si (silicon), strained Si, (silicon carbide), Ge (germanium), SiGe (silicon germanium), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CaS (cadmium sulfide), CdTe (cadmium telluride), ZnO (zinc oxide), ZnSe (zinc selenide), ZnS (zinc sulfide), or ZnTe (zinc telluride)), or any combination thereof. In an exemplary embodiment, the substrate 110 includes silicon so that the channel region has both electron and hole mobility properties.

A first-type doped source (or doped source) 130 is arranged on the substrate/bulk layer 110 over a counter-doped layer 120. The doped source 130 and the counter-doped layer 120 are formed on the substrate/bulk 110 incorporating dopants into the substrate/bulk 110 or forming an epitaxial growth on the substrate/bulk 110. The doped source 130 is heavily doped with a dopant, which may be a p-type dopant (e.g., boron or gallium) or an n-type dopant (e.g., phosphorus or arsenic). The counter-doped layer 120 includes a dopant that is different/opposite the dopant in the doped source 130. For example, when the doped source 130 includes a p-type dopant, the counter-doped layer 120 includes an n-type dopant, and when the doped source 130 includes an n-type dopant, the counter-doped layer 120 includes a p-type dopant. In a preferred embodiment, the doped source 130 is heavily doped, including a dopant concentration in a range from about $4 \times 10^{20}$ cm$^{-3}$ to about $2.5 \times 10^{21}$ cm$^{-3}$. The thickness of the counter-doped layer 120 may be in a range from about 10 to about 100 nanometers (nm,) or from about 30 to about 70 nm. The thickness of the doped source 130 may be in a range from about 50 nm to about 250 nm, or from about 70 nm to about 100 nm.

In a preferred embodiment, the first-type doped source (or doped source) 130 is n-typed doped and the counter-doped layer 120 is p-typed doped.

Figure 2:
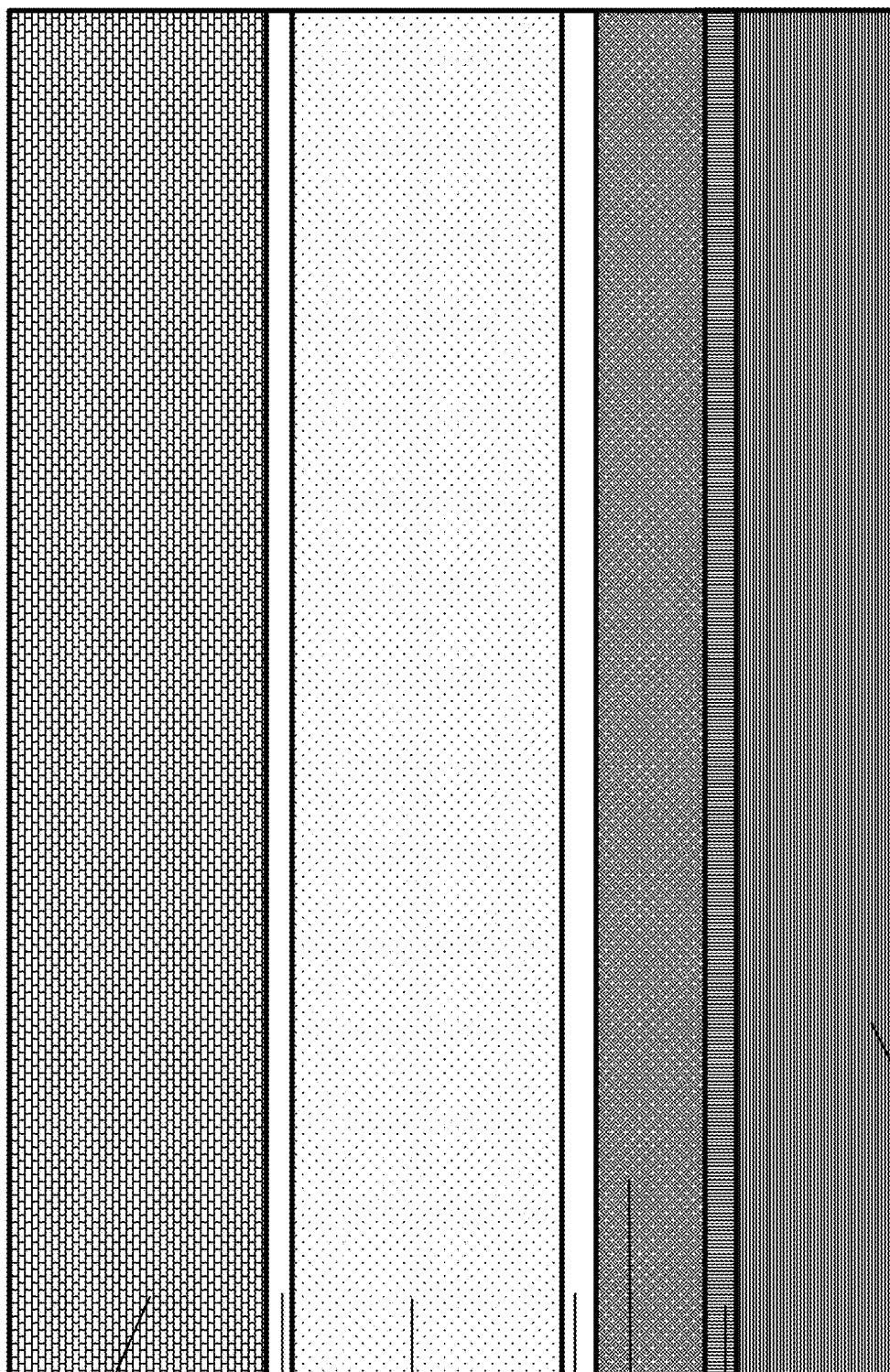
FIG. 2 is a cross-section of the initial structure of FIG. 1 with a bottom and top spacer, dummy gate layer, an oxide layer deposited.

FIG. 2 is a cross-section of the structure 100 of FIG. 1 with a bottom 240 and top 260 spacer, dummy gate layer 210, a dielectric/oxide layer 220 deposited.

The bottom spacer 240 and top spacer 260 are made of insulating material including, for example, silicon dioxide, silicon nitride, SiOCN, or SiBCN. Other non-limiting examples of materials for the bottom spacer 240 and the top spacer 260 include dielectric oxides (e.g., silicon oxide), dielectric nitrides (e.g., silicon nitride), dielectric oxynitrides, or any combination thereof. The top spacer 240 and bottom spacer 260 materials are deposited by a deposition process, for example, chemical vapor deposition (CVD) or physical vapor deposition (PVD). The bottom spacer 240 and the top spacer 260 may each have a thickness of about 3 to about 15 nm, or of about 5 to about 10 nm. Deposition processes allow the thickness of the spacers (240, 260) to be precisely controlled.

The dummy gate 210 is disposed between the bottom spacer 240 and top spacer 260. First the bottom spacer 240 is deposited on the doped source 130, then the dummy gate 210 is deposited on the bottom spacer 240, and afterwards the top spacer 260 is deposited on the dummy gate layer 210.

The dummy gate 210 is made of a sacrificial gate material including, for example, amorphous silicon (α-Si) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 210 has a thickness of about 10 nm to about 100 nm, or from about 20 nm to about 50 nm. Known deposition techniques enable the thickness of the dummy gate layer 210 to be controlled precisely.

The dielectric capping layer 220 is deposited on the top spacer 260 over the dummy gate 210. Non-limiting examples of materials for the dielectric capping layer 220 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 220 has a thickness in a range from about 30 nm to about 200 nm, or from about 50 nm to about 100 nm.

Figure 3:
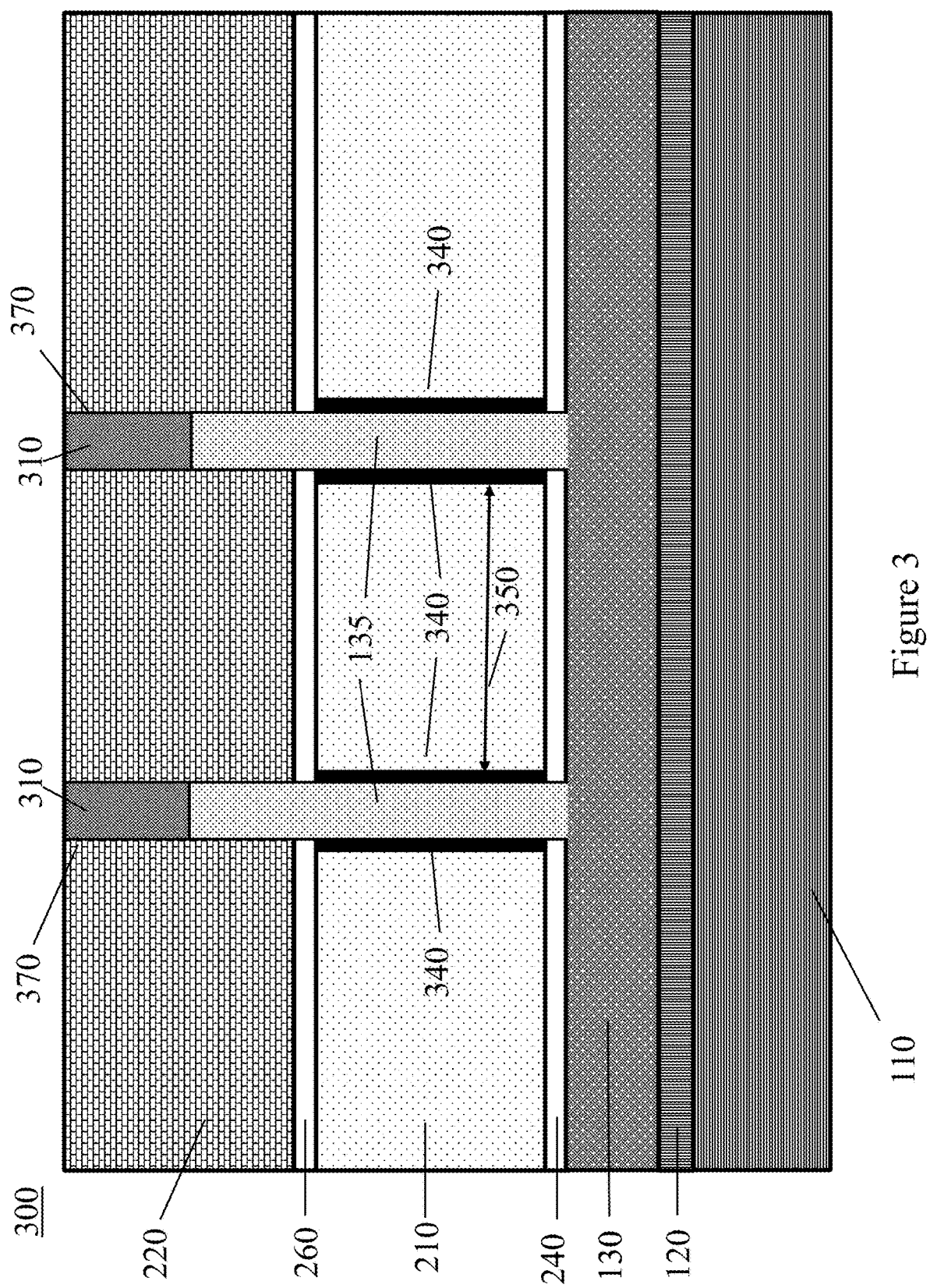
FIG. 3 is a cross-section of the structure in FIG. 2 after a channel location, fin epitaxial growth and recess, channel top deposition, and chemical-mechanical polishing (CMP.)

FIG. 3 is a cross-section of the structure in FIG. 2 after a channel location, fin structure epitaxial growth and recess, channel top deposition, and chemical-mechanical polishing (CMP.) Masking steps are omitted for clarity.

First, two trenches 370 are formed through the dielectric capping layer 220, top spacer 260, and the dummy gate 210 to expose the bottom spacer 240. Therefore, the trenches 270 extend through surface of the dielectric capping layer 370 to the top of the bottom spacer 240.

The etch process forming the trenches 370 may be, for example, a reactive ion etch.

The trench 370 width may be about 3 nm to about 20 nm, or about 5 nm to about 10 nm. The depth of the trench 370 may be about 50 nm to about 300 nm, or from about 100 to about 200 nm. Using the etch process, the trench 370 width and depth can be precisely controlled.

There is an inter-trench distance 350 between the sides of trenches 370 opposing one another. The smaller the inter-trench distance 350 is, the more densely the finished devices can be packed. However, in the final device if the inter-trench distance 350 is made too small, electrical activity of the latter formed channels in one trench will affect the channel in the other trench. In preferred embodiments, the inter-trench distance 350 is greater than 10 nm but less than 100 nm. In more preferred embodiments, the inter-trench distance 350 is greater than 20 nm but less than 50 nm.

Next the bottom spacer 240 is etched through to expose the doped source 130 layer. The bottom spacer 240 may be etched using a process that is selective to (will not substantially remove) the doped source 130 material. The bottom spacer 240 may be etched by, for example, a reactive ion etch (ME) so as to expose a portion of the underlying doped source layer 130 on which a source extension can be epitaxially grown from the doped source layer 130.

These etching steps allow the two channel regions that eventually will be in the trenches 370 to be aligned, parallel, with uniform sides and a constant inter-trench distance 350 throughout the length of the channels/trenches 370. The junction later formed between the each of the channels and doped source 130 will be aligned, substantially positioning the junction of each channel at the doped source 130 at the same elevation with respect to the top of the bottom spacer 240.

Next the dummy gate 210 material exposed on the side wall of the trenches 370 is oxidized. A thin layer of oxide 340 is formed along the sidewall. The oxidation may be performed by a plasma oxidation process or other oxidation process that forms the thin oxide 340 layer. Any oxide formed on the doped source 130 as well as on the bottom spacer 240 are removed before performing the epitaxial growth step next in the process step.

An epitaxial layer 135 is grown on the doped source 130 within the trench 370 after removing the oxide 340 on the doped source 130 surface as well as exposed bottom spacer 240 section at trench bottom to form an epitaxial channel (also called a channel region, channel, fin structure, and/or fin channel) 135. The epitaxial growth includes an epitaxial semiconductor material. The epitaxial growth and/or deposition processes are selective to forming on semiconductor surfaces (e.g. the doped source 130 surface) but not depositing material on dielectric surfaces. Initially, the epitaxial growth in the epitaxial channel 135 can extend over the dielectric capping layer 220.

The epitaxial channel 135 may be grown using a suitable growth process, for example, chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial channel material 135 may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

The epitaxial channel material 135 remains undoped. For example, in a preferred embodiment, the epitaxial channel material 135 has a doping concentration level remaining below $1 \times 10^{18}$ cm$^{-3}$.

The material grown in the epitaxial channel 135 is then planarized. The planarization process may be a CMP process. Planarization removes excess epitaxial growth over the dielectric capping layer 220.

At this point the material in the epitaxial channel 135 is partially recessed from the surface of the dielectric capping layer 220 and both voids caused by the recess at the top of the epitaxial channel 135 are filled with a dielectric material 310. The dielectric material 310 is then planarize. The partial recessing of the epitaxial channel is to a level that is still within the dielectric capping layer 220 and yet over the top spacer 260. The epitaxial channel 135 is recessed by etching, for example, by a reactive ion etch or a wet etch process.

The dielectric material 310 may be a dielectric (e.g., silicon oxide or silicon nitride), or oxynitride, or any combination thereof. The dielectric material 310 is deposited by a deposition process, for example, chemical vapor deposition (CVD) or physical vapor deposition (PVD). After deposition, the dielectric 310 is planarized, by for example, CMP. The dielectric material 310 forms a dielectric cap.

Figure 4:
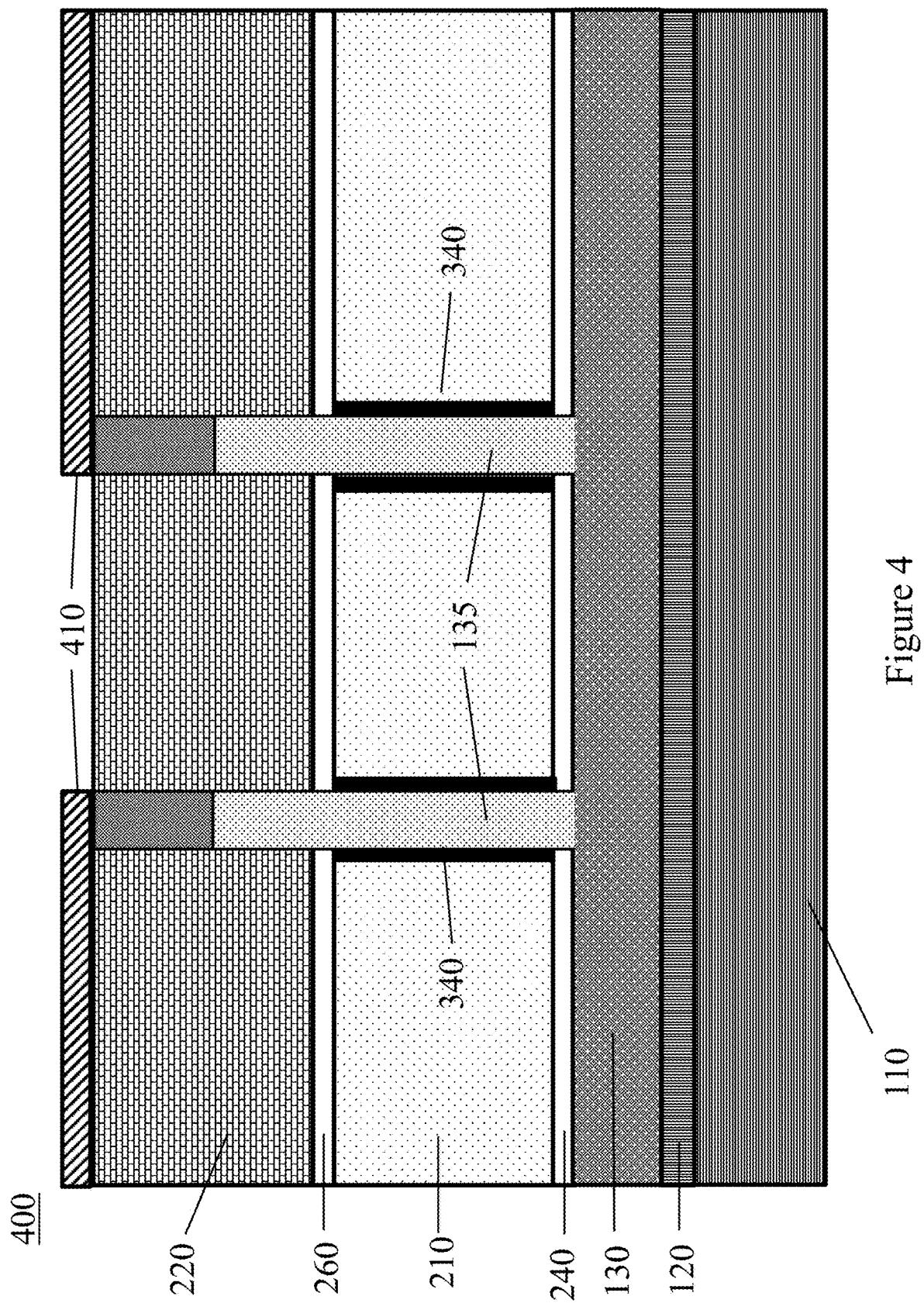
FIG. 4 is a cross-section of the structure in FIG. 3 masked to prepare for an etching step between the two fins/epitaxial channels.

FIG. 4 is a cross-section 400 of the structure in FIG. 3 masked to prepare for an etching step that etches material between the two fins/epitaxial channels 135. A mask 410 is deposited exposing the material in the inter-trench distance 350 between the sides of trenches 370/epitaxial channels 135. The mask protects the dielectric capping layer 220 that is not between the epitaxial channels 135.

In preferred embodiments, the mask 410 covers the entire top of the epitaxial channel 135.

In preferred embodiments, the mask 410 is a hard mask made of materials including silicon nitride and silicon oxide which are deposited by standard techniques including physical vapor deposition (PVD) and lithographic processes.

Figure 5:
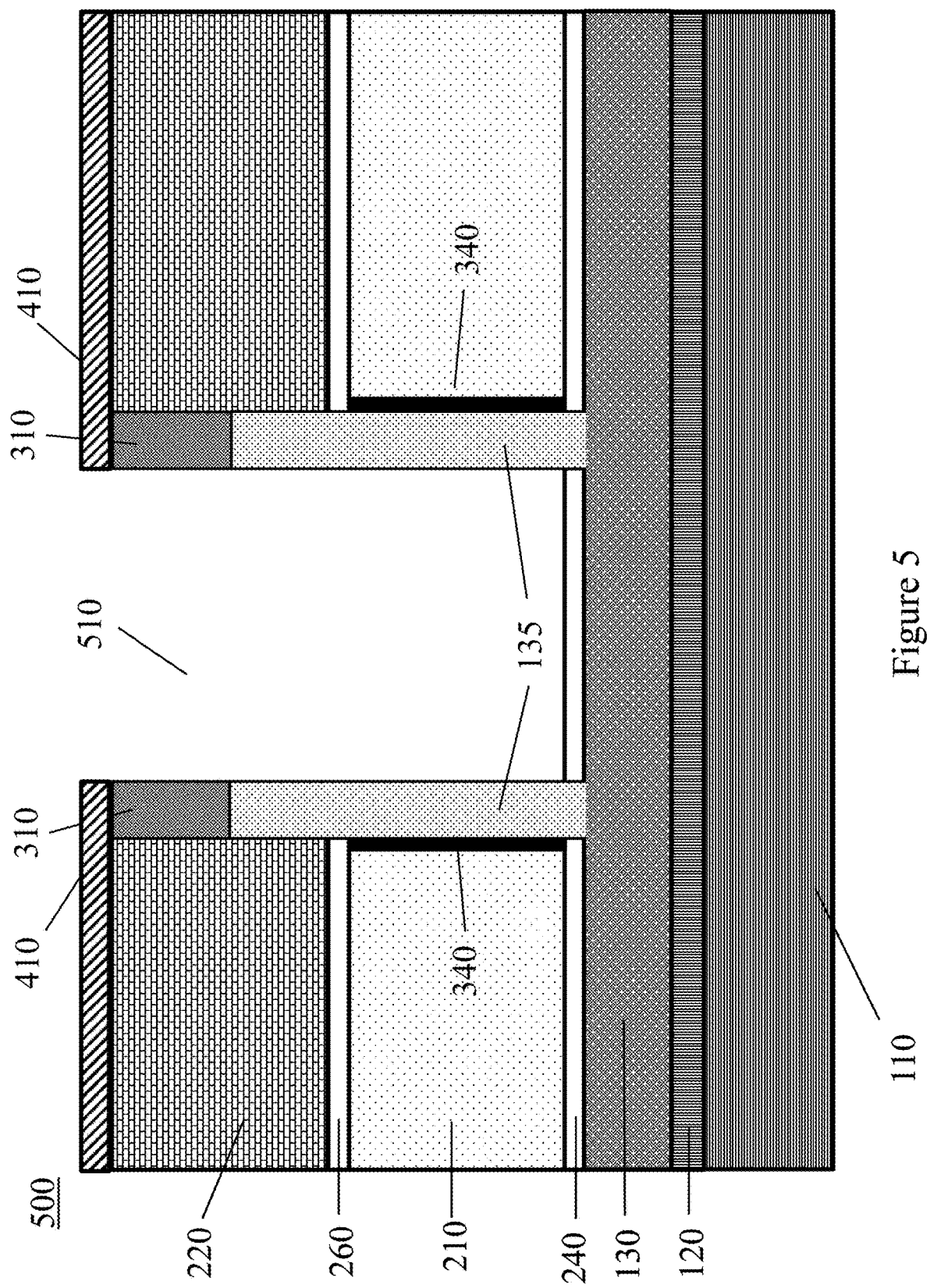
FIG. 5 is a cross-section of the structure in FIG. 4 where the oxide, top spacer, and dummy gate are etched down to the bottom spacer between the two fins to open space between the fins.

FIG. 5 is a cross-section 500 of the structure in FIG. 4 where the material between the epitaxial channels 135 is removed down to but not including the bottom spacer 240. The material between the channel fins/epitaxial channels 135 that is removed includes: the dielectric capping layer 220, the top spacer 260, and the dummy gate material 210.

This material is removed using standard techniques reactive ion etching (ME) techniques.

Figure 6:
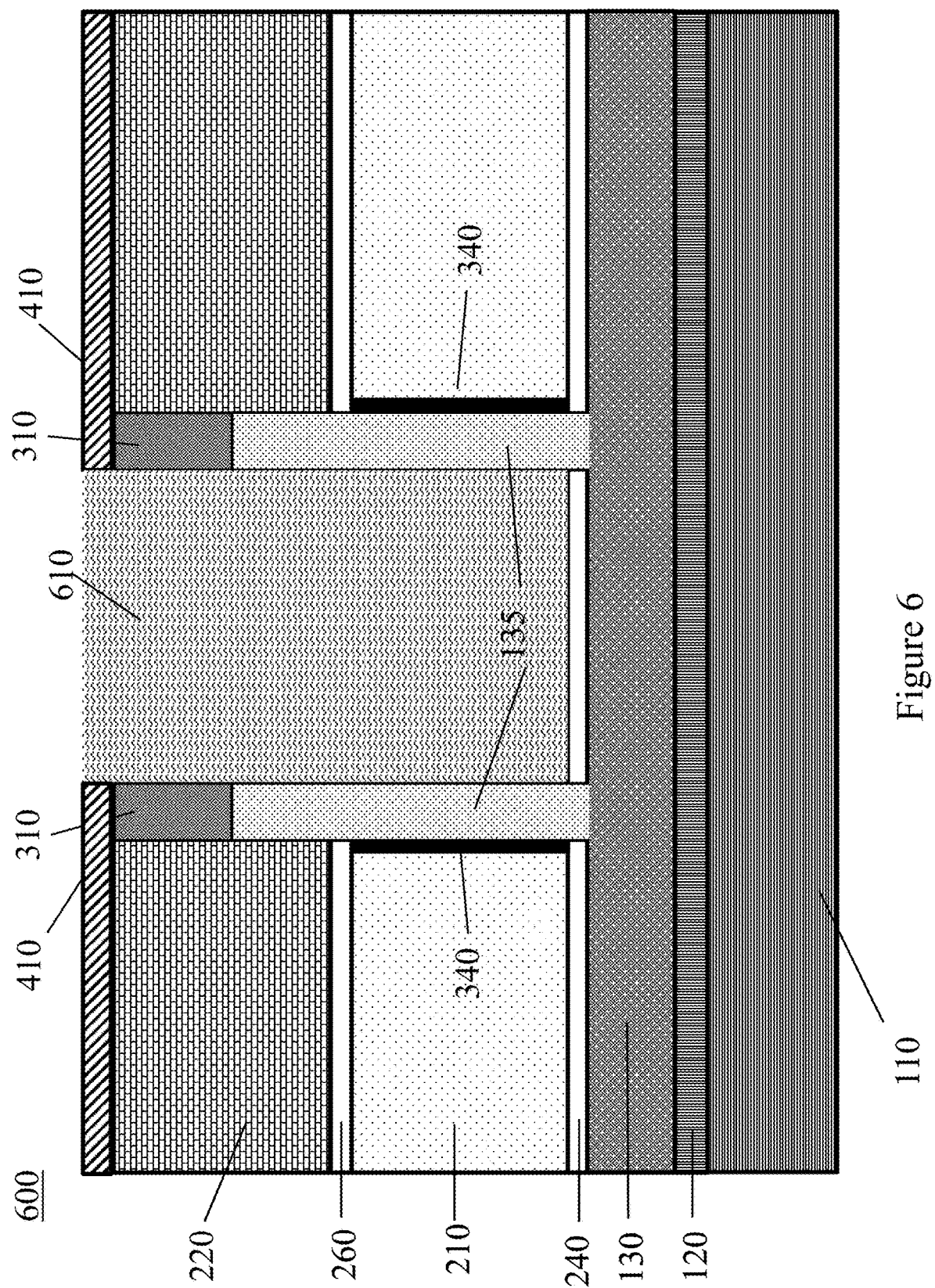
FIG. 6 is a cross-section of the structure in FIG. 5 where an oxide is deposited to fill the open space between the fins/epitaxial channels.

FIG. 6 is a cross-section of the structure 600 where silicon oxide 610 is deposited to fill the open space between the epitaxial channels 135 created in FIG. 5. In the preferred embodiment where the mask 410 protects the epitaxial channel 135 tops, the width of the etched out, open space between the epitaxial channels 135 retains a uniform inter-trench distance 350.

The open space is filled with dielectric material, e.g. silicon oxide 610. In preferred embodiments, the silicon oxide 610 is a defective oxide. Defective oxides have more electron-hole pairs generated when exposed to radiation.

In a preferred embodiment, the oxide 610 material includes any of the following: $SiO_2$, $SiN_x$, $SiON$, $Al_2O_3$, and $HfO_2$.

The oxide 610 is deposited by known methods like Plasma Enhanced Chemical Vapor Deposition (PECVD) or flowable oxide.

The hole trapping in oxides like silicon oxide is known when they are deposited by various types of methods, e.g. thermal chemical vapor deposition, etc. These methods cause "defect centers" formed by oxygen vacancies. The oxygen vacancies are found in two silicon atoms joined by a weak strained Si—Si bond where an oxygen should be (but is missing). Such oxygen-deficient SiOx (x<2) is energetically unstable until it captures a positive charge (e.g., holes generated by the ionizing radiation in the oxide). It has been demonstrated that additional oxygen vacancies can be created by injecting of energetic particles (ions, electrons, etc.)

Figure 7:
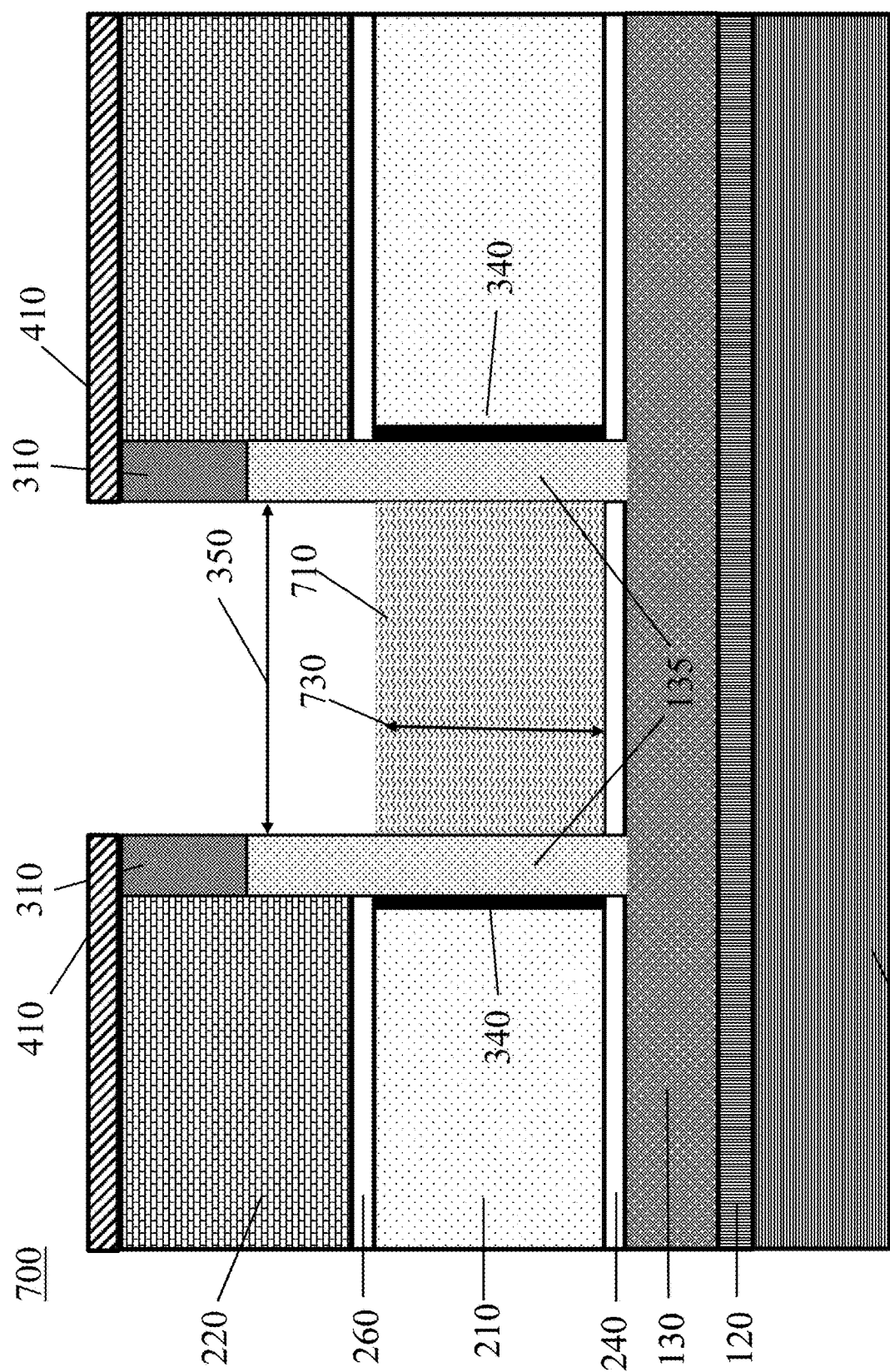
FIG. 7 is a cross-section of the structure of FIG. 6 after the oxide between the fins is recessed showing a precisely defined length and thickness of the oxide remaining.

FIG. 7 is a cross-section of the structure of FIG. 6 after the silicon oxide 610 between the fin structures is recessed resulting in a precisely defined length and thickness of the oxide 710 remaining. The silicon oxide 610 has been recessed to the point where an oxide height 730 is about the elevation of the top spacer 260. In preferred embodiments, the silicon oxide 610 is removed until the silicon oxide height 730 is below the elevation of the top spacer 260. In alternative embodiments the silicon oxide 610 is densified, e.g. by a low temperature anneal and/or a UV cure.

In preferred embodiments, the silicon oxide 610 is recessed by RIE processes.

These processes are used so that the oxide height 730 can be precisely controlled. In a preferred embodiment, the oxide height 730 is small enough so the epitaxial channel/fin channel 135 has a uniform cross section and large enough to increase the sensitivity of the current flow from the source to the drain. In a preferred embodiment, the oxide height 730 between 20 nm and 500 nm.

After the oxide 610 is recessed, the oxide 610 remaining between the structure forms a charge collector region 710 with precise dimensions. For example, the charge collector region 710 has the width of the inter-trench distance 350 and the height equal to the oxide height 730. Therefore, the charge collector region as an aspect ratio, e.g. the ratio of the oxide height 730 to inter-trench distance 350 that can be precisely made using standard materials and techniques. In preferred embodiments, the oxide height 730 is more than 5 to 10 times the inter-trench distance 350. This gives maximum contact between the charge collector region 710 and the sides of the epitaxial channels 135 (for increased sensitivity) while minimizing the area the device requires.

The charge collector region 710 of precise dimension and proportions is placed between both epitaxial channels 135 to affect the electrical characteristics of the epitaxial channels 135 related to the amount of charge stored (holes trapped) within the charge storage region 710.

Figure 8:
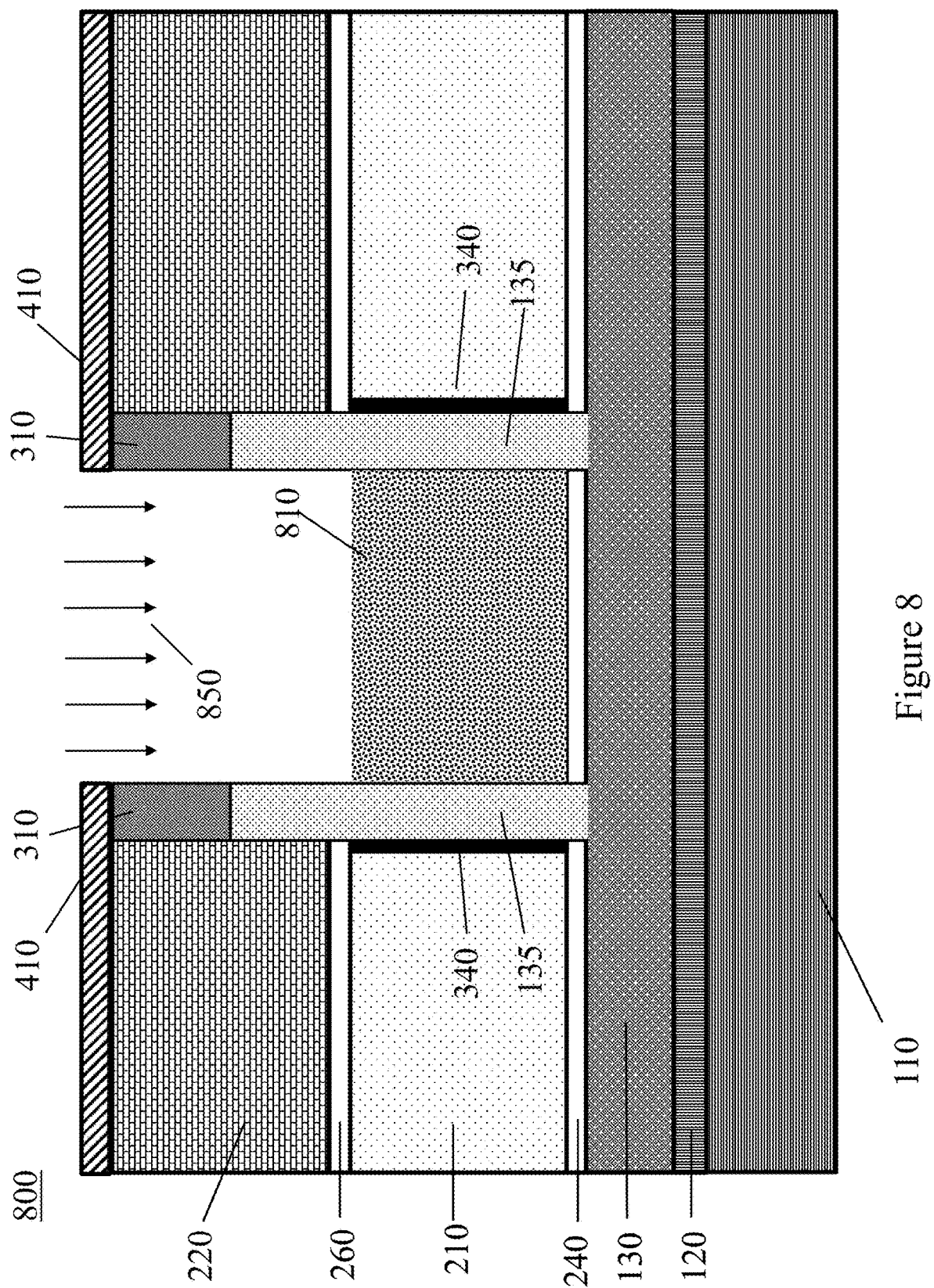
FIG. 8 is a step where the oxide between the fin structures is implanted to create an implanted charge collection region capable of producing a larger number of electron-hole pairs when exposed to radiation.

FIG. 8 shows a structure 800 where the charge collector region 710 is irradiated to implant 850 material into the charge collector region 710 to create an implanted charge storage region 810. The implantation produces a larger number of hole traps within the implanted charge collector region 810.

In a sense, the silicon oxide 610 in the charge collector region 710 becomes more "defective" as ions are implanted 850 to create the implanted charge collector region 810 with more hole traps.

Due to the vertical structure 800 and the masks 410, the implantation 850 can increase the charge level within the implanted charge storage region 810 without damaging the epitaxial channels 135 (protected by the masks 410) or the doped source 130 layer (or even the bulk 110 and counter doped 120 layers), which is/are protected by the thickness 710 of the implanted charge storage region 810 and the bottom spacer 240.

By controlling the time and/or the intensity of the implantation 850, the number of hole traps produced can be controlled.

Increasing the number of hole traps in the implanted charge storage region 810 increases the sensitivity of the sensor. However, if too many holes are trapped, the epitaxial channels can electrically short together or otherwise be influenced electrically through the implanted charge storage region 810.

In preferred embodiments, one or more of the following is implanted into the implanted charge storage region 810: ions, oxygen ions, hydrogen ions, H+; argon ions, Ar+; and electrons through high-energy (10-200 keV) electron beams.

The implantation 850 is done by one or more of the following methods: ion beam implantation and electron beam implantation.

In a preferred embodiment, the implantation 850 (e.g. hole traps formation) in the implanted charge collector region 810 is low enough so that there is no conductivity between the epitaxial channels 135 but is high enough to capture more holes created by the ionizing radiation to increase sensitivity. For example, implantation levels for hydrogen ions, H+ are between 1e13 and 1e17 cm-2 at 40-100 keV; for argon ions, Ar+ are between 1e10 and 1e15 cm-2 at 25-200 keV; and for electrons are between 1-500 milliCoulomb (mC) at 10-200 keV.

Note that the implanted charge storage region 810 electrically influences the epitaxial channels 135. Influencing factors of the implanted charge collector region 810 include: the concentration of hole traps which is controlled by the implantation 850; the surface interface between the sides of the epitaxial channels 135 and the implanted charge collector region 810 which is related to the oxide height 730; and the total volume (related to amount of contained charge/holes) of the implanted charge collector region 810 which is related to the aspect ratio. These among other factors determine the sensitivity of the device for measuring radiation dose. These design features are precisely controlled by the methods of making the invention and can be optimized in the device structure.

Figure 9:
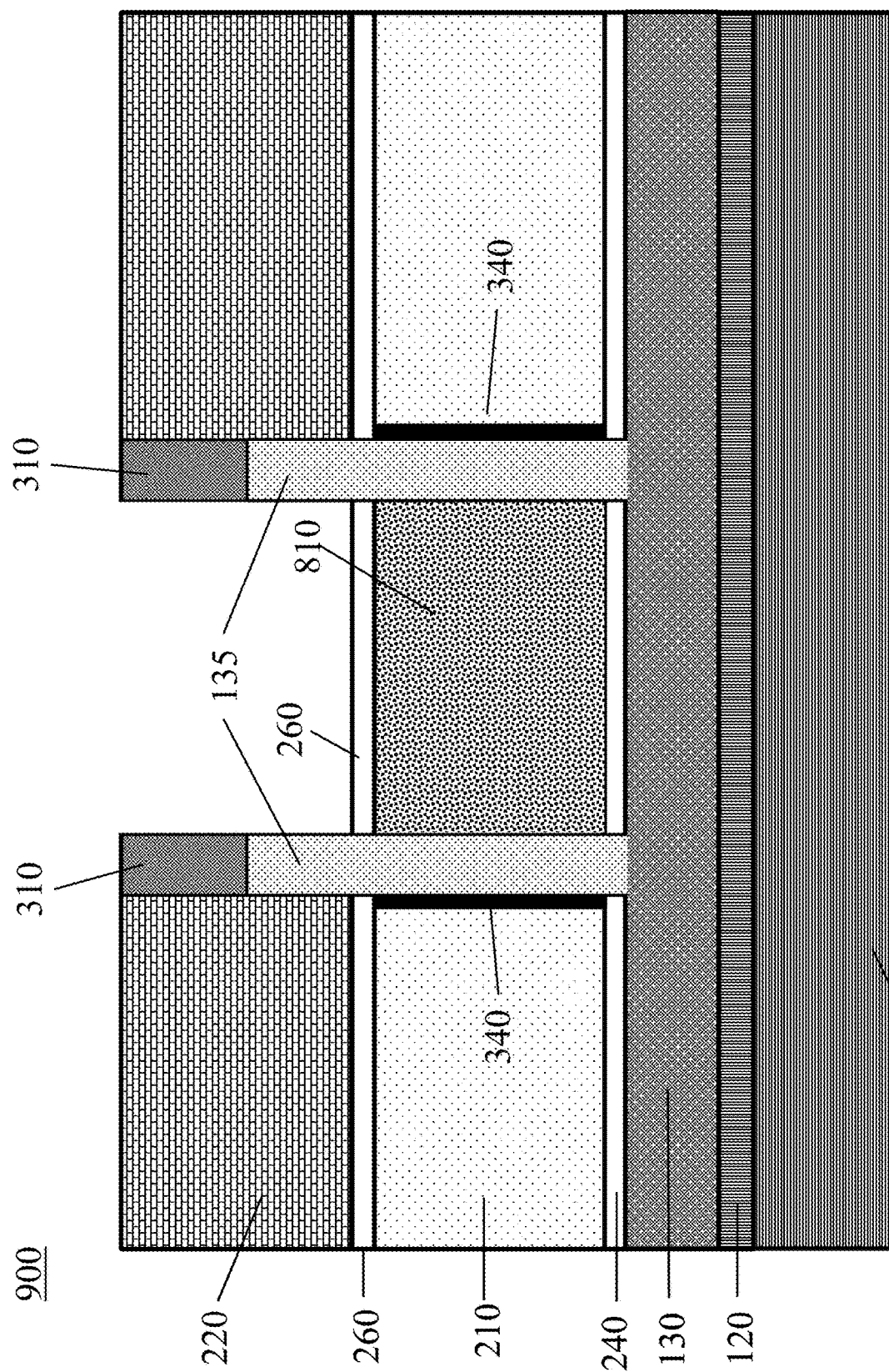
FIG. 9 is a cross-section of the structure of FIG. 8 after removal of the hardmask and re-forming the top spacer over the implanted charge collection region.

FIG. 9 is a cross-section of the structure 900 after the hardmask 410 is removed and a top spacer layer 260 is reformed over implanted charge collector region 810.

The hardmask 410 is removed using known selective processes like wet or dry etching. The top spacer layer 260 is redeposited as it initially was. The known masking steps are not shown.

Figure 10:
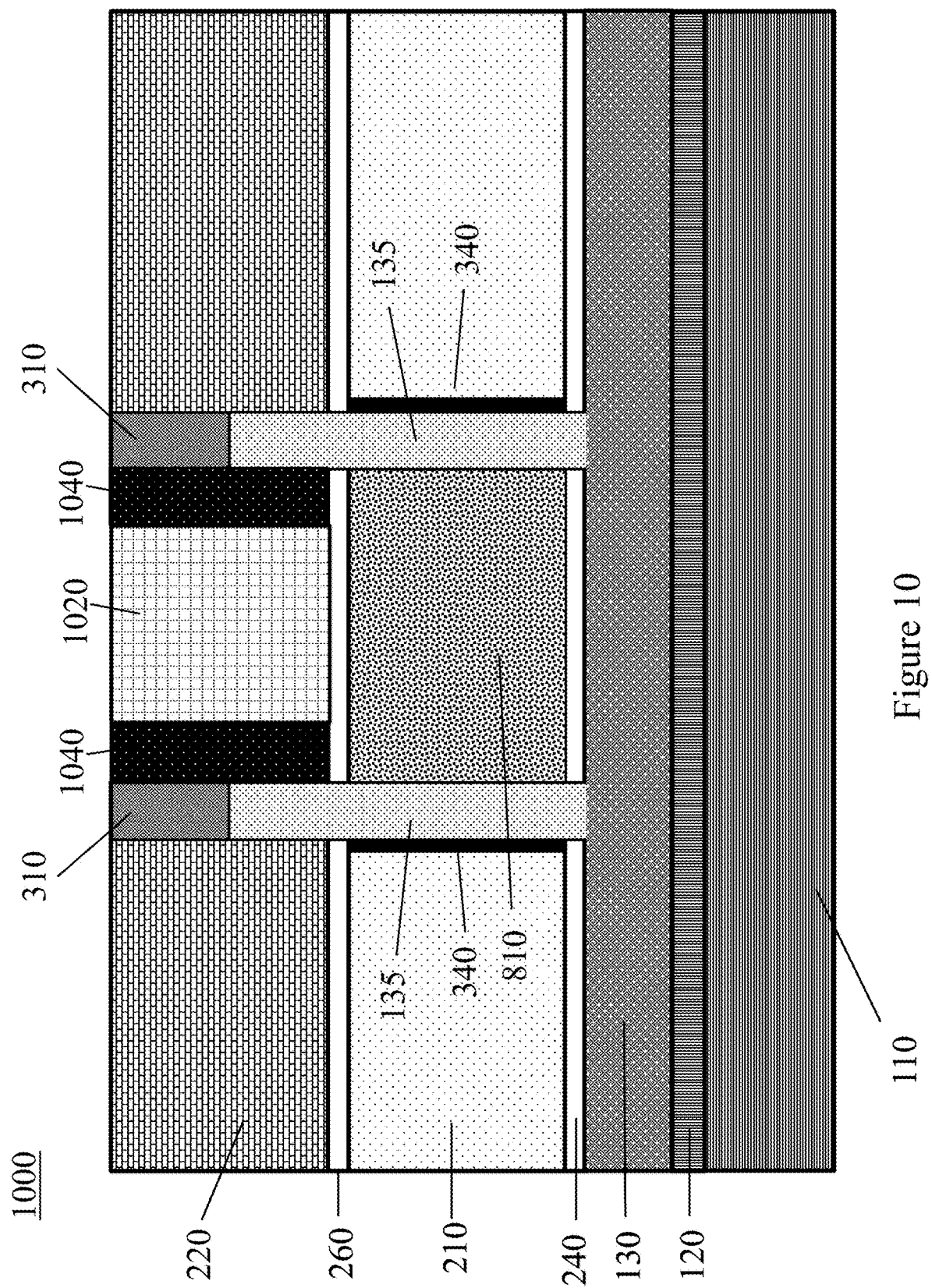
FIG. 10 is a cross-section of the structure of FIG. 9 after an inner spacer deposition, an interlayer dielectric (ILD) fill, and CMP.

FIG. 10 is a cross-section of the structure 1000 after a deposition of an inner spacer 1040, a deposition of interlayer dielectric (ILD) fill 1020, and a chemical mechanical polishing (CMP) to smooth the surface of the structure 1000.

The inner spacers 1040 are deposited on the exposed sides of the epitaxial channels 135 and the dielectric material 310. The inner spacers 1040 are insulating material made of any one or more of the following: dielectric oxides (e.g. silicon oxide), dielectric nitrides (e.g., silicon nitride), dielectric oxynitrides, or any combination thereof. The inner spacers 1040 are deposited by one of the following non-limiting methods: a chemical vapor deposition (CVD) or physical vapor deposition (PVD.) The inner spacer 1040 material can be removed from the surface of the top spacer 260 layer by a ME process, e.g. a dry etch process so that the inner spacer 1040 only remains on the side of the epitaxial channel 135 and dielectric 310.

In a preferred embodiment, the inner spacers 1040 have a thickness between 5 nm and 50 nm or from 15 nm to 30 nm.

The volume between the inner spacers 1040 is filled by depositing an interlayer dielectric (ILD) material 1020. The ILD 1020 may be formed from, for example, a low-k dielectric material (with k<4.0), including but not limited to, silicon oxide, spin-on-glass, a flowable oxide, a high-density plasma oxide, borophosphosilicate glass (BPSG), or any combination thereof. The ILD 1020 is deposited by a deposition process, including, but not limited to CVD, PVD, plasma enhanced CVD, atomic layer deposition (ALD), evaporation, chemical solution deposition, or like processes.

Figure 11:
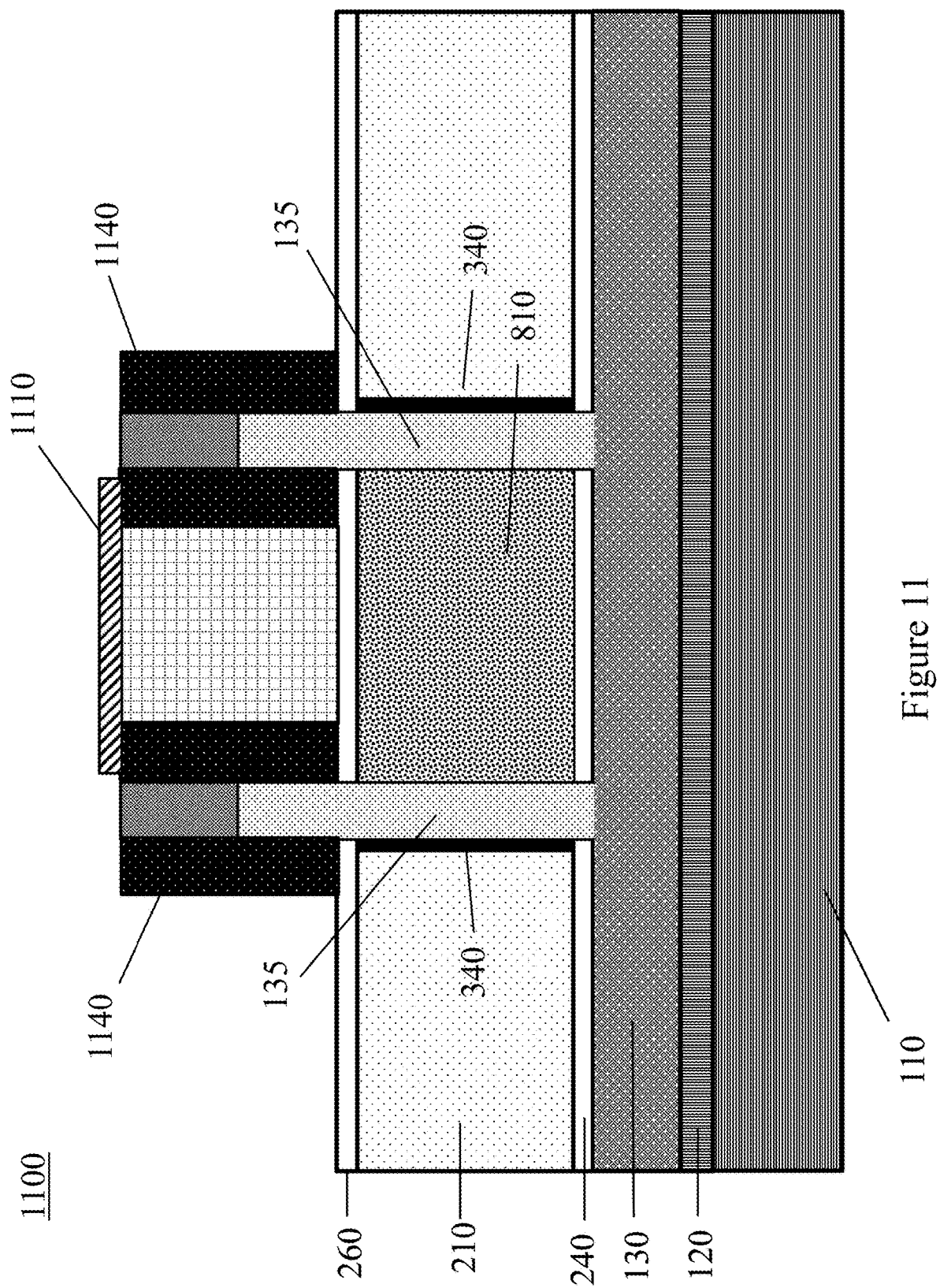
FIG. 11 is a cross-section of the structure of FIG. 10 after formation of a hardmask, removal of oxide, and formation of an outer spacer.

FIG. 11 is a cross-section of the structure 1100 after formation of a hardmask 1110, removal of the dielectric/oxide layer 220 oxide, and formation of an outer spacer 1140.

The hardmask 1110 can be made of the same materials and by the same methods as mask 410. The hardmask 1110 covers the ILD 1020 and inner spacers 1040 but leaves the dielectric material 310 and the rest of the epitaxial channels 135 exposed from the top of the structure 1100.

The dielectric 220 layer is removed by known selective removal methods. Removal of the dielectric 220 layer exposes the upper spacer 260 surface outside of the epitaxial channels 135.

The outer spacer 1140 can be made of the same materials and by the same methods as the inner spacers 1040. Together, the outer 1140 and inner 1040 spacers define and protect the upper portion of the epitaxial channels 135, including the dielectric material 310 capping the channels 135.

Figure 12:
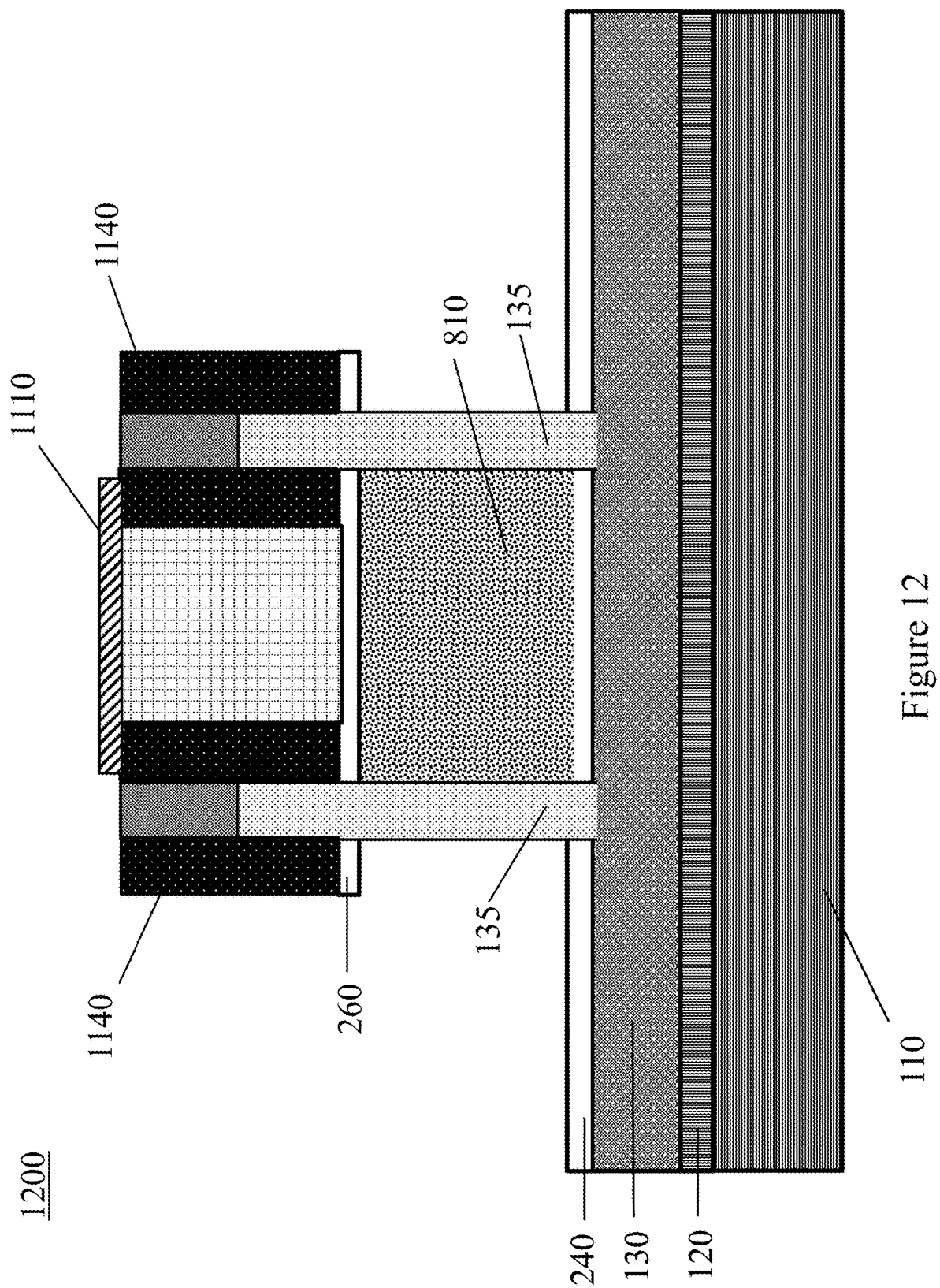
FIG. 12 is a cross-section of the structure of FIG. 11 after removal of some of the top spacer and removal of all the dummy gate and thin oxide.

FIG. 12 is a cross-section of the structure 1200 after removal of some of the top spacer 260, all of the sacrificial dummy gate 210, and the remaining thin oxide layers 340.

In one preferred embodiment, the removal is done by an etch process that selectively does not remove the bottom spacer 240. A small part of the top spacer 260, protected by each of the outer spacers 1140, also is not removed. The etch process may be a dry etch process, such as a RIE process. A wet etch process step, e.g. applying hot ammonia, follows to remove the remainder of the dummy gate 210 material and to expose the thin oxide layers 340.

The thin oxide layer 340 removed by a RIE or wet etching.

The epitaxial channel 135 sides opposite the implanted charge storage region 810 and the top surface of the bottom spacer 240 are exposed for the next steps of depositing the gate structure.

Figure 13:
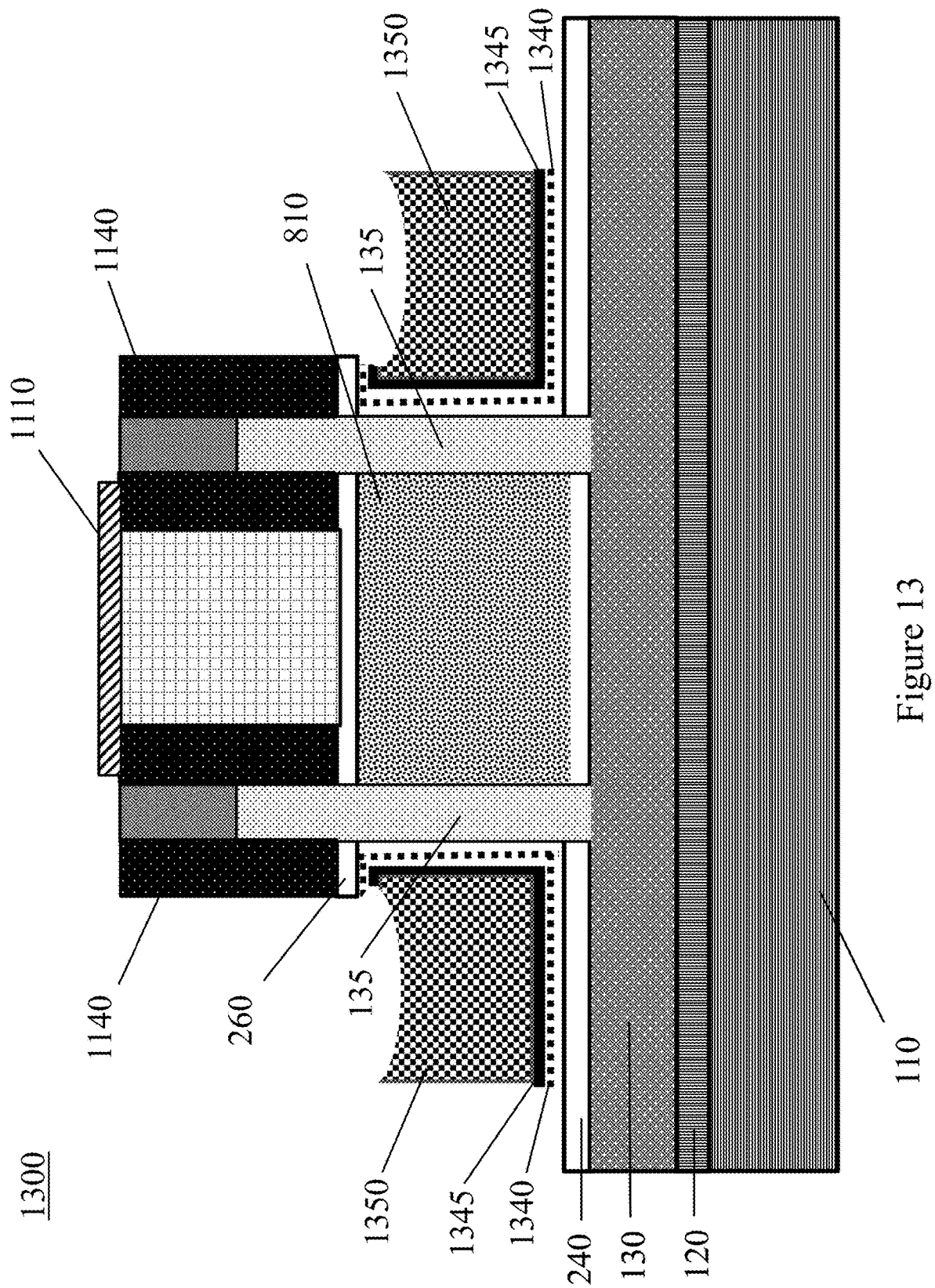
FIG. 13 is a cross-section of the structure of FIG. 12 after the gate is formed.

FIG. 13 is a cross-section of the structure 1300 after the gate is formed.

After the thin oxide layer 340 is removed, a gate dielectric material 1340 is deposited. Then a work function metal 1345 is deposited upon the gate dielectric material 1340.

The dielectric material 1340 and the work function metal 1345 form a portion of a gate stack that replaces the dummy gate 210. The gate dielectric material 1340 and the work function metal 1345 are disposed on the bottom spacer 240, the epitaxial channel 135, and beneath the remaining and exposed portions of the top spacer 260.

The gate dielectric material(s) 1340 can be a dielectric material having a dielectric constant greater than 3.9, 7.0, or 10.0. Non-limiting examples of suitable materials for the gate dielectric material 1340 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 1340 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 1201 may vary depending on the deposition process as well as the composition and number of high-k dielectric materials used.

The work function metal(s) 1345 may be disposed over the gate dielectric material 1340. The type of work function metal(s) 1345 depends on the type of transistor. Non-limiting examples of suitable work function metals 1345 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) 1345 may be deposited by a suitable deposition process, for example, CVD, PECVD, PVD, plating, thermal or e-beam evaporation, and sputtering.

In preferred embodiments, the work function metal 1345 of both gates is electrically connected and surrounds both of the channels around a gate side of the channels. (The gate side of channels is across each channel from the charge storage side of the respective channel.)

A metal gate material 1350 is deposited on the work function metal 1345. The metal gate material 1350 is a conductive gate metal that is deposited over the gate dielectric material(s) 1340 and work function metals 1345 to form the gate stack. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive metal gate material 1350.

Figure 14:
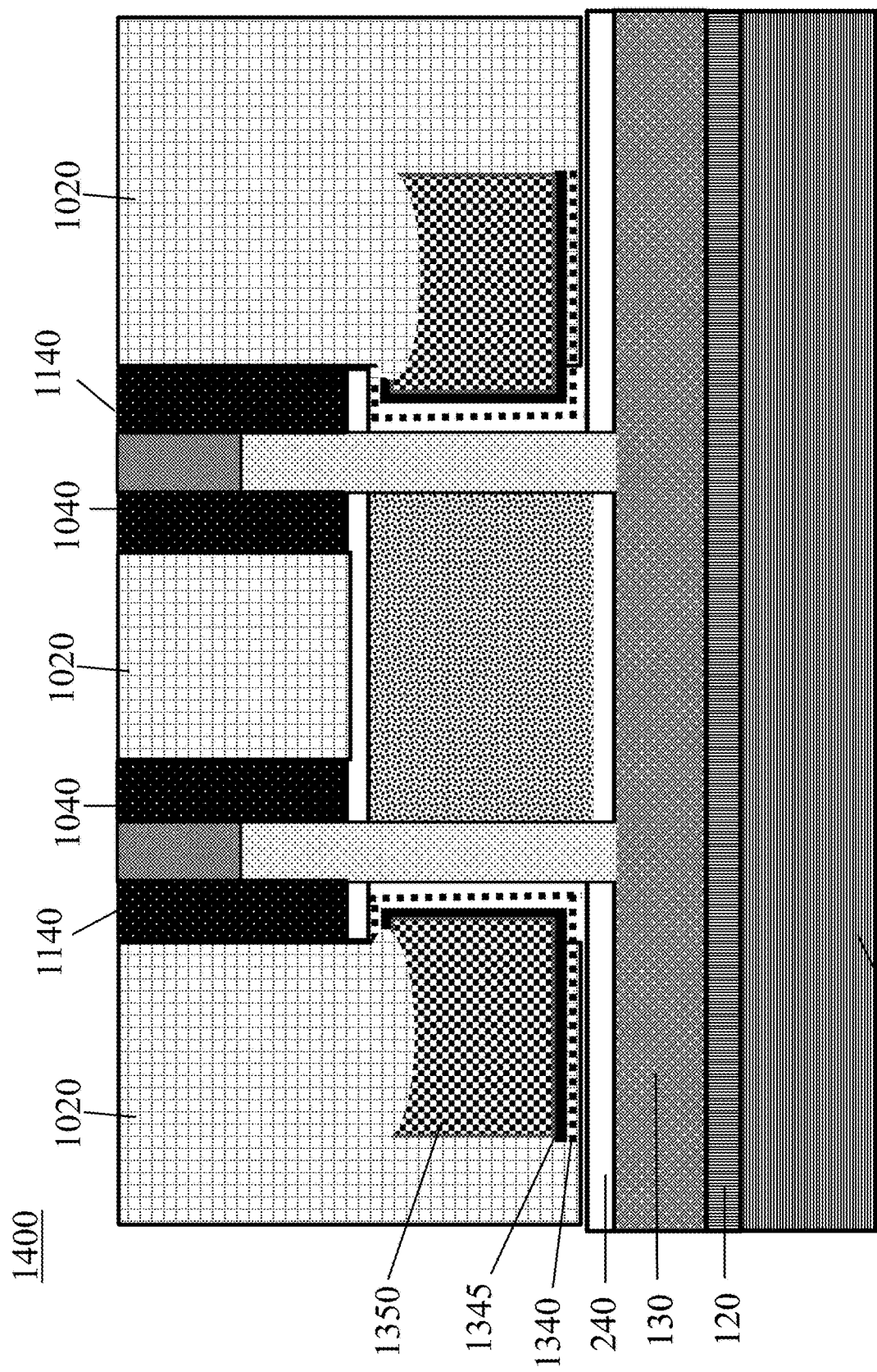
FIG. 14 is a cross-section of the structure of FIG. 13 after the hard mask is removed, ILD is deposited over the structure, and a CMP is performed.

FIG. 14 is a cross-section of the structure of FIG. 13 after the hard mask 1110 is removed, ILD 1020 is deposited over the structure, and a CMP is performed.

The hard mask 1110 is removed in the same manner the hard mask 410 is removed, e.g. selective processes like wet or dry etching.

The volume around the gate stack (1340, 1345, and 1350) is now filled by depositing an interlayer dielectric (ILD) material 1020. As in the description of FIG. 10, the ILD 1020 may be formed from, for example, a low-k dielectric material (with k<4.0), including but not limited to, silicon oxide, spin-on-glass, a flowable oxide, a high-density plasma oxide, borophosphosilicate glass (BPSG), or any combination thereof.

The ILD 1020 is deposited by a deposition process, including, but not limited to CVD, PVD, plasma enhanced CVD, atomic layer deposition (ALD), evaporation, chemical solution deposition, or like processes.

Figure 15:
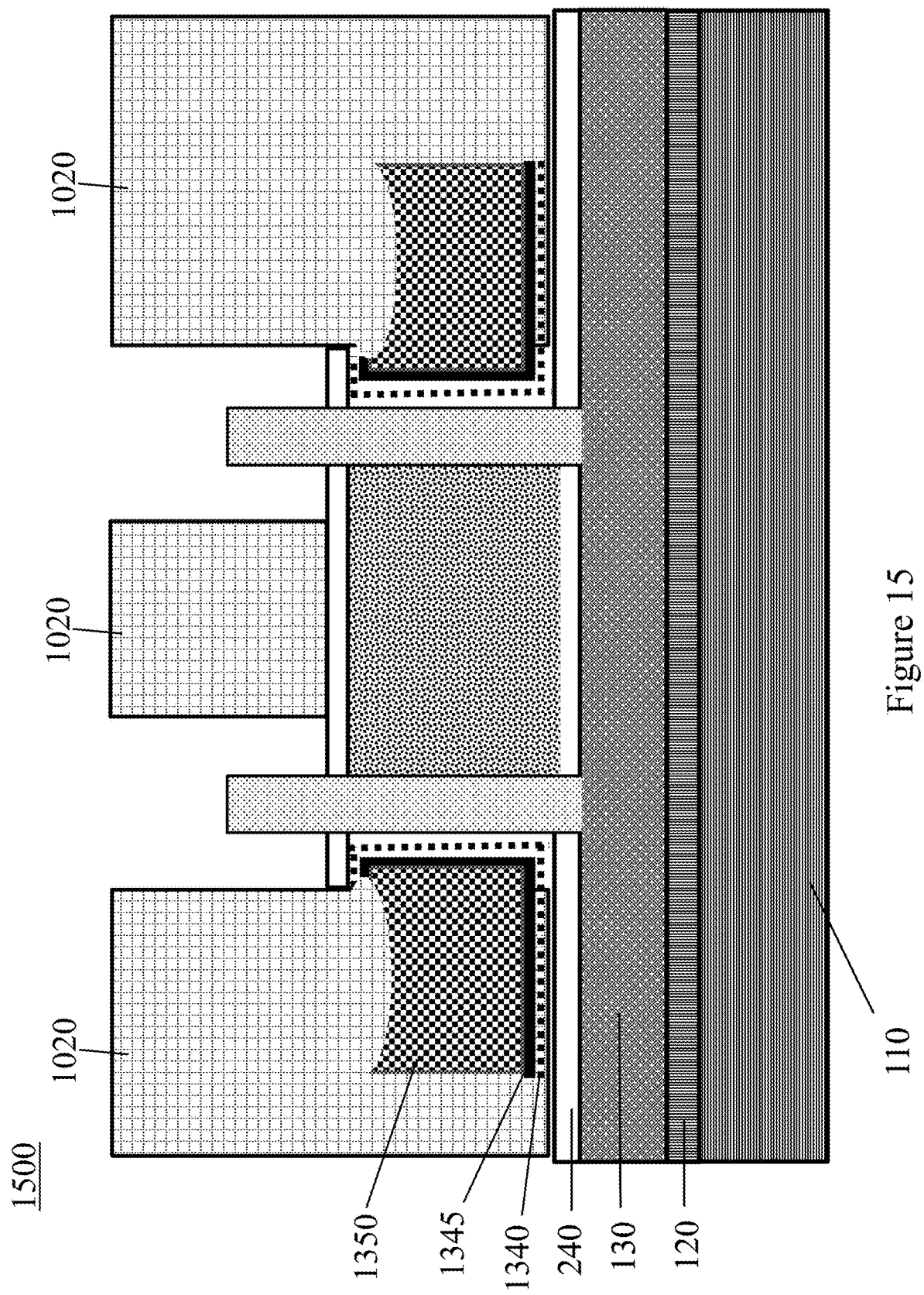
FIG. 15 is a cross-section of the structure of FIG. 14 after the vertical transistor hard masks and spacer materials are removed exposing the top of the epitaxial channel/fin channel.

FIG. 15 is a cross-section of the structure 1500 after the vertical transistor dielectric material 310 and inner 1040 and outer 1140 spacer materials are removed exposing the top of the epitaxial channel/fin channel 135.

The spacers (1040, 1140) and the dielectric material 310 removed by selective etching, either through RIE or wet etching.

Figure 16:
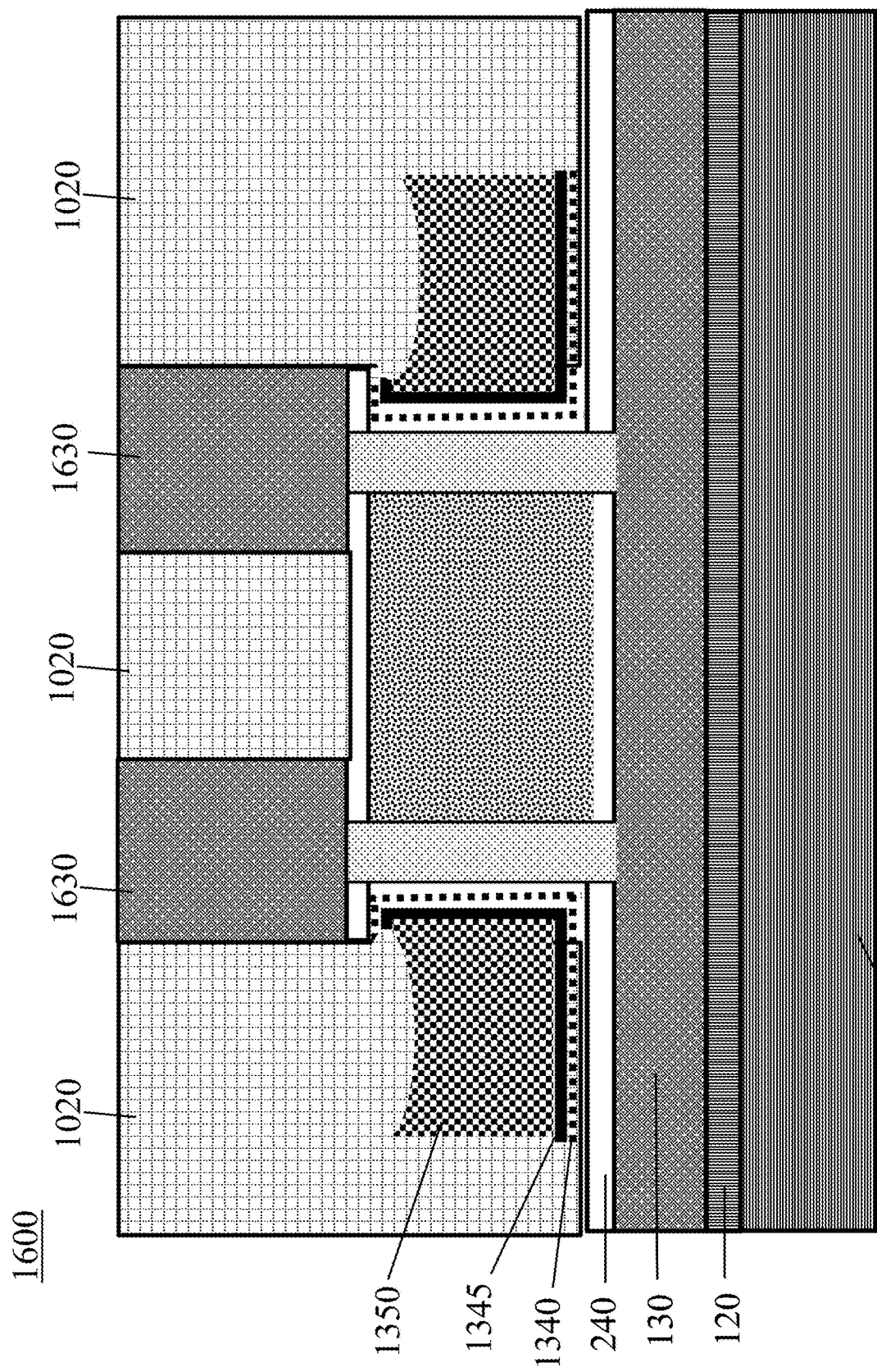
FIG. 16 is a cross-section of the structure of FIG. 15 after an epitaxially growth in-situ of a first-type doped top source/drain.

FIG. 16 is a cross-section of the structure 1600 after an epitaxially growth in-situ of a first-type doped top source/drain 1630.

The exposed surface of the top of the epitaxial channel/fin channel 135 and surrounding top spacer 260 is seeded. As the growth progresses, it also follows along all crystal orientations (vertical, lateral, diagonal), with growth faster (thicker epitaxial layer) along certain orientations while slower (thinner epitaxial layer) along other orientations. Selective epitaxy processes can be done at well controlled temperatures that keep the underlying channel 135 intact.

In preferred embodiments, the doping levels and materials should be the same as in layer 130.

Figure 17:
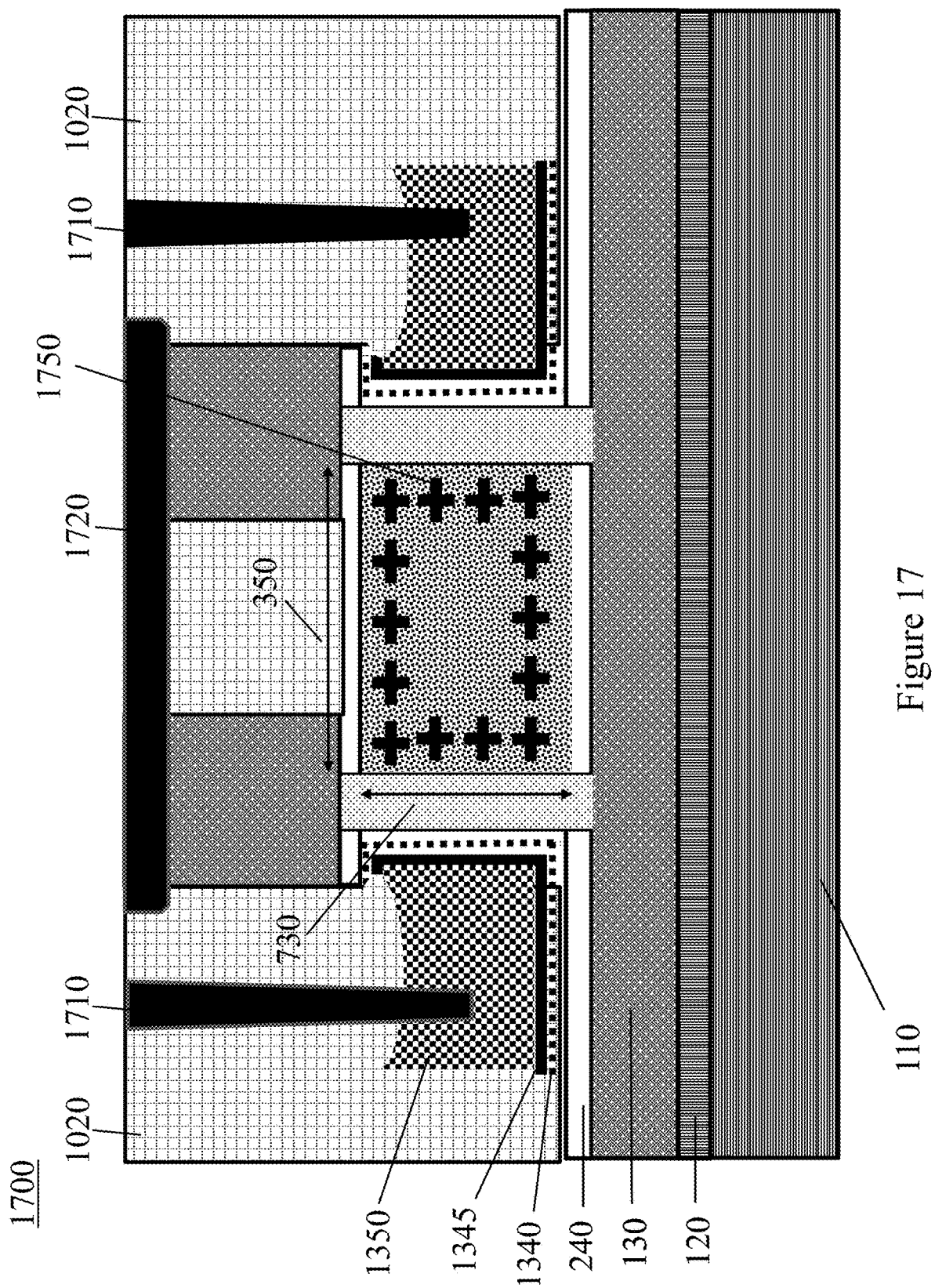
FIG. 17 is a cross-section of the structure of FIG. 16 with external contacts formed showing a final preferred structure of a vertical transistor-based radiation dosimeter.

FIG. 17 is a cross-section of the structure 1700 with external contacts formed connecting to the drain 1720 and the gate 1710 and a final preferred structure of a vertical transistor-based radiation dosimeter.

The gate contacts 1710 extend from the surface of the ILD 1020 to the metal gate material 1350. The gate contacts 1710 are formed by patterning a trench in the ILD 1020. To remove the ILD 1020 and form the gate contact trenches, a resist, such as a photoresist, may be deposited and patterned. An etch process, such as a RIE, may be performed using the patterned resist as an etch mask to remove the ILD 1020 until the gate 1710 is exposed.

The gate contact trenches are filled with a conductive material 1710 or a combination of conductive materials. The conductive material may be a conductive metal, for example, aluminum (Al), platinum (Pt), gold (Au), tungsten (W), titanium (Ti), Cobalt (Co) or any combination thereof.

The conductive material may be deposited by a suitable deposition process, for example, CVD, PECVD, PVD, plating, thermal or e-beam evaporation, or sputtering.

In like manner, using the same processes and materials, a connection pattern/mask can be formed over the drains 1630 on top of the epitaxial channel 135. In a preferred embodiment, a long shallow trench is etched, e.g. using RIE, to recess the ILD 1020 and tops of the drains 1630. The trench is then filled with conductive material 1710, like that used in the gate contacts 1710, and deposited by the same methods.

In some preferred embodiments, both drains 1630 are electrically connected by a single, shared drain contact. In alternative embodiments, each drain contact 1720 can be separate.

A planarization process, for example, CMP, is performed to remove any excess conductive material 1710 or 1720 from the surface of the ILD 1020.

FIG. 17 shows one embodiment of a completed structure 1700 with the precisely controlled dimension of the implanted charge collector region 810, the oxide height 730, the inter-trench distance 350, and the increase in trapped holes 1750 due to the implantation 850.

In a preferred embodiment, the aspect ratio is in the range where the oxide height 730 is between 5 to 10 times greater than inter-trench distance (or inter-channel distance) 350 in order to increase the sensitivity of the dosimeter 1700.

Figure 18:
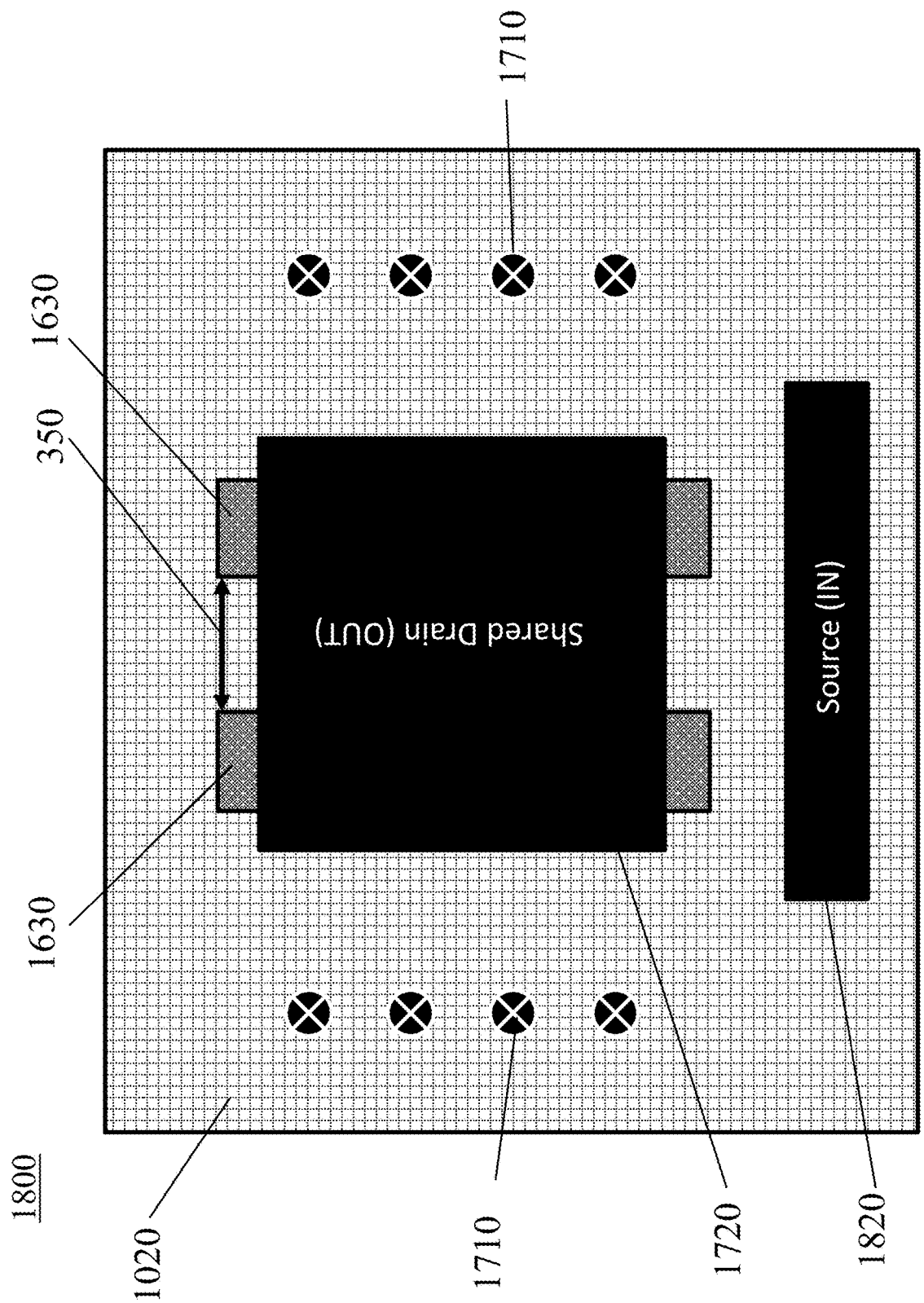
FIG. 18 is a top view of one preferred vertical transistor-based radiation dosimeter.

The connection to the source 130 will be shown in FIG. 18.

FIG. 18 is a top view of one preferred vertical transistor-based radiation dosimeter 1800. The gate contacts 1710 are shown penetrating through the ILD 1020 to electrically connect to the gate metal material 1350. The drain connection 1720 spans and electrically connects the drains 1630 of the device 1800. The top view of the source connection 1820 to the source 130 is shown. The source connection 1820 is created using the same methods and materials as those used with the gate contacts 1710 and drain connection 1720. However, the trench for the source connection 1820 goes through the ILD 1020 and the bottom spacer 240 in order to make electrical contact with the source 130.

Figure 19:
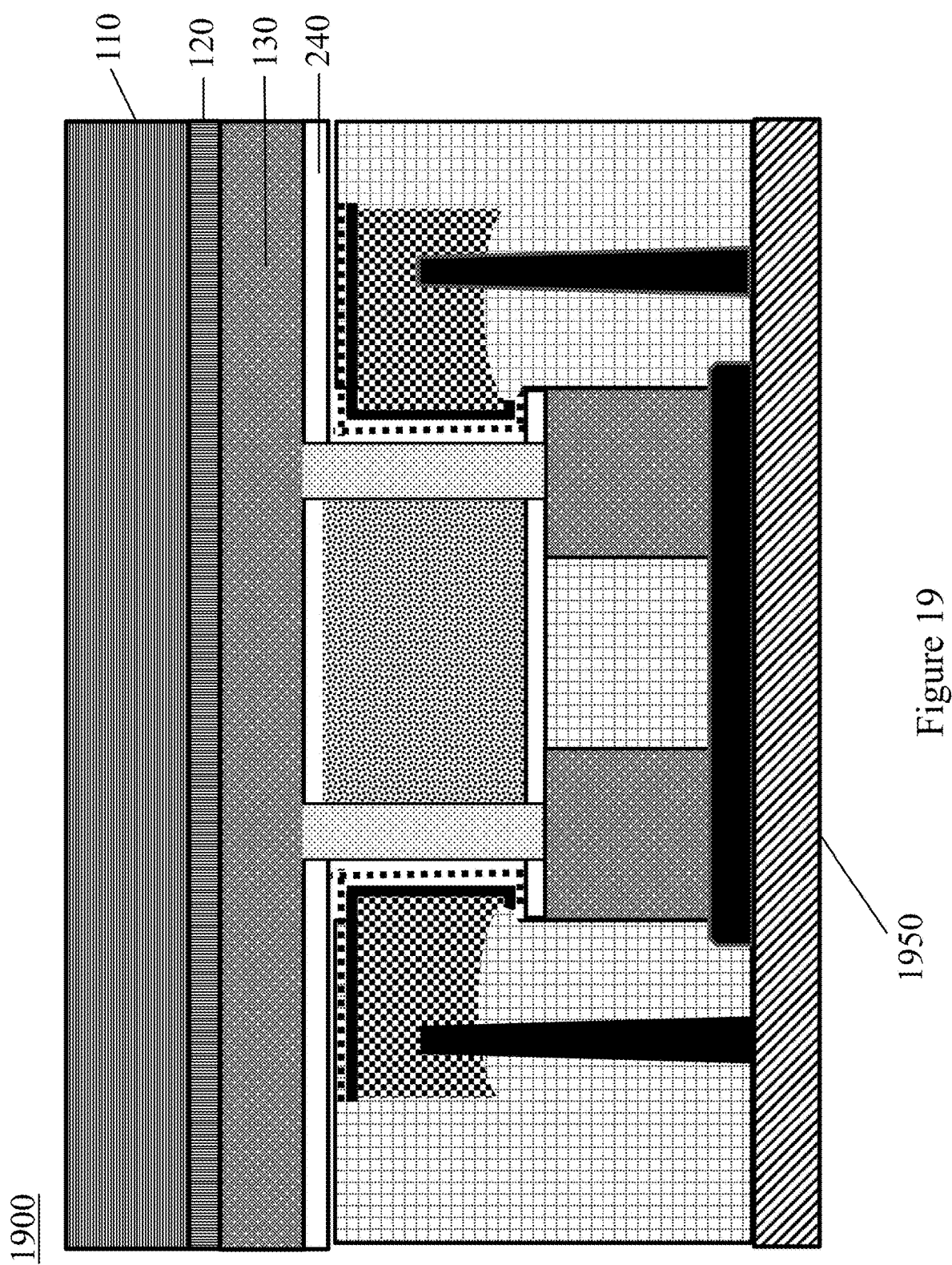
FIG. 19 is a cross-section of one preferred final structure of a vertical transistor-based radiation dosimeter with a handle substrate attached to the top surface and rotated 180 degrees.

FIG. 19 is a cross-section of one preferred final structure of a vertical transistor-based radiation dosimeter 1900 with a handle substrate 1950 attached to the top surface of the device, e.g. 1800. The structure 1900 is rotated 180 degrees from the orientation shown in FIG. 18. The handle structure can be a semiconductor material, glass, etc. attached by an adhesive or other means that permits manipulation and further processing of the structure 1900. Upon completion of the processing the handle substrate 1950 can be easily removed, e.g. with an epoxy solvent. Such handle substrates 1950 are known.

Figure 20:
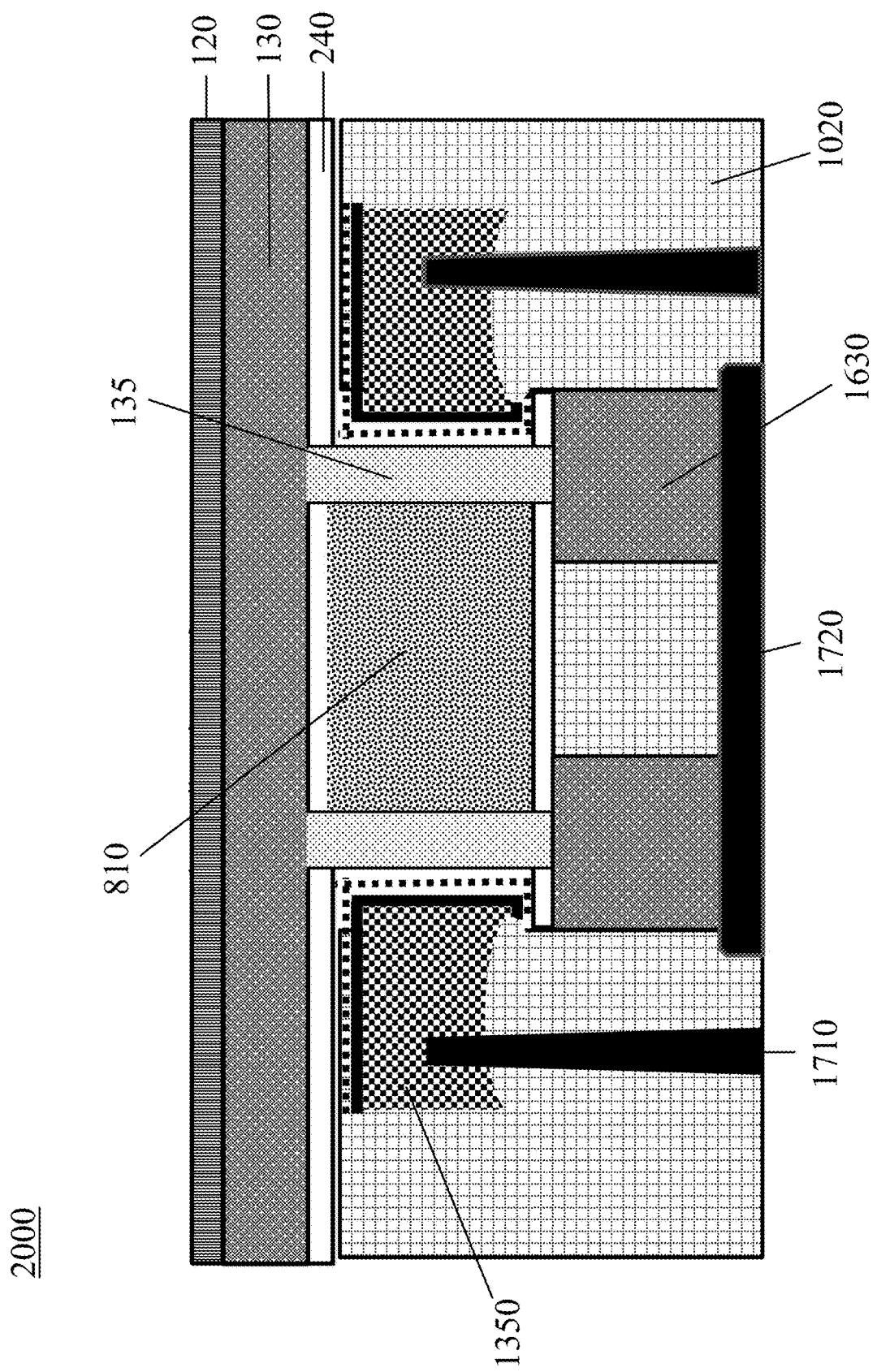
FIG. 20 is a cross-section of a second preferred final structure of a vertical transistor-based radiation dosimeter with the handle and bulk layer removed.

FIG. 20 is a cross-section of a second preferred final structure 2000 of a vertical transistor-based radiation dosimeter with the handle 1950 and bulk/substrate layer 110 removed. As stated, the handle 1950 can be removed by known methods, e.g. epoxy solvents. The bulk/substrate layer 110 can be removed by any process that selectively removes the material from which the bulk/substrate is made. Examples of these methods include: grinding, polishing, using a silicon on insulator (SOI) wafer as starting substrate. For example, if using an SOI to start, a preferred process would be to grind most of the backside silicon 110, then etch the remaining silicon, then etch the oxide (the BOX, e.g. any material remaining above layer 120 and in some embodiments some or all of layer 120.) In an alternative embodiment, some or all of the bulk/substrate layer 110 is left on the structure.

Removal of the bulk/substrate 110 allows any radiation measured to penetrate only 2 layers, the counter-doped layer 120 and doped source layer 130 before the radiation impacts the trapped hole density in the implanted charge storage region 810.

Figure 21A:
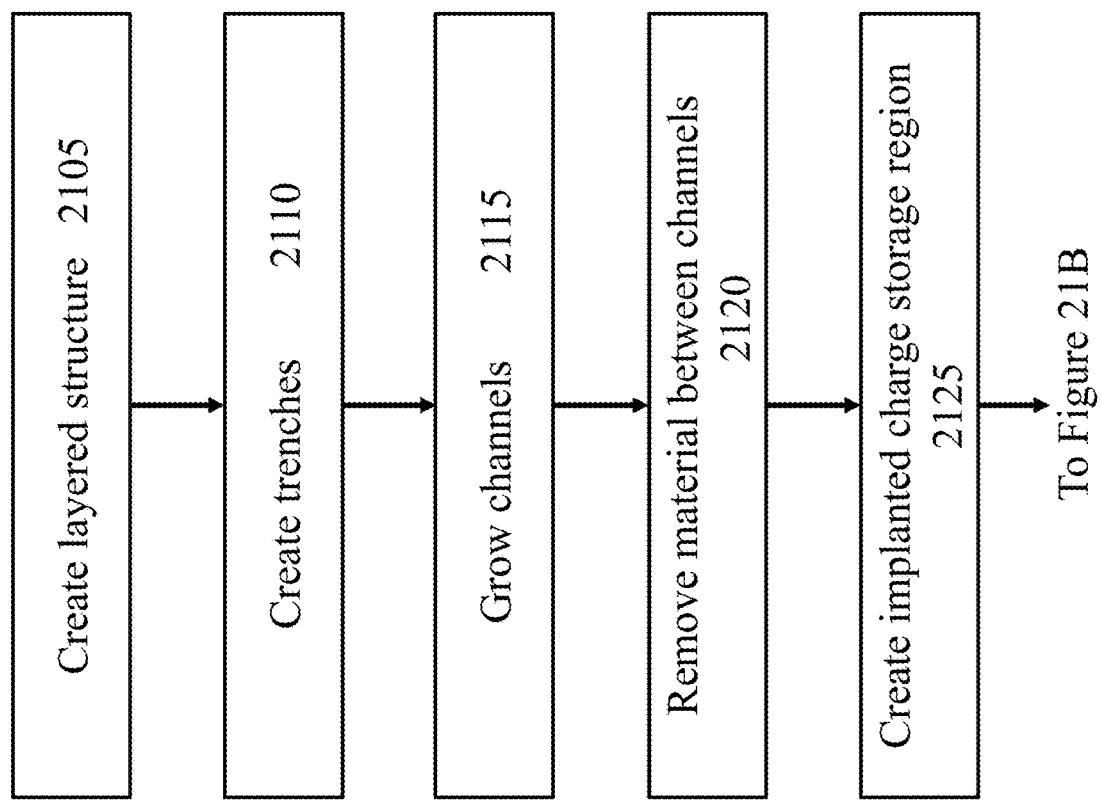
FIG. 21A is a flow chart of one preferred process for making vertical transistor-based radiation dosimeter.
Figure 21B:
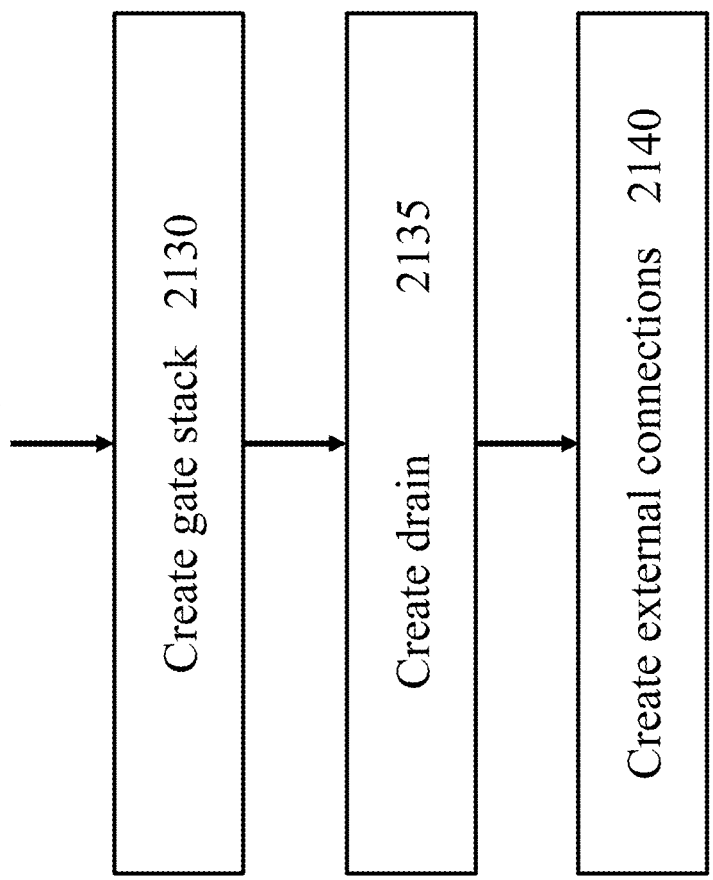
FIG. 21B is a flow chart of one preferred process for making vertical transistor-based radiation dosimeter and is a continuation of FIG. 21A.

FIG. 21 is a flow chart 2100 of one preferred process for making vertical transistor-based radiation dosimeter, e.g. 2000.

In step 2105, a layered structure is created. As described above and starting with a bulk layer 110, a counter-doped layer 120 is disposed on the bulk layer 110, a first-type doped source layer 130 is disposed on the counter-doped layer 120, a bottom spacer 240 is disposed on the first-type doped source layer 130, a dummy gate layer 210 is disposed on the bottom spacer 240, a top spacer 260 is disposed on the dummy gate layer 210, and a dielectric layer 220 is disposed on the top spacer.

In step 2110 two trenches 370 are created 2110 through the dielectric layer 220, dummy gate layer 210, and top 260 and bottom 240 spacers exposing a top of area of the first-type doped source layer 130.

In step 2115 a channel (epitaxial channel) 135 is grown 2115 in each of the trenches 370 from the top of the first-type doped source layer 130. The channels 135 are spaced an inner-channel distance 350 apart.

In step 2120 material between the channels 135 is removed as described above.

In step 2125 an oxide material 610 is deposited between the channels 135 and recessed 710 to have a thickness dimension 730. The oxide 710 is implanted 850 to transform the oxide material 710 into an implanted charge storage region 810 interfacing with each opposing side of the channels.

In step 2130, as described above, material is removed and a gate stack (1340, 1345, and 1350) is created.

In step 2135, as described above, material is removed and a first-type doped drain is formed on each of the channels 135.

In step 2140 external electrical connections are made to the a first-type doped source layer, the gate stack, and the first-type doped drain as described in the description of FIGS. 17 and 18.

The structures disclosed have many uses. As non-limiting examples, dosimeters (e.g. 2000) have uses in dosimetry (nuclear) safety and security. Because they are inexpensive and small, they can be used in radiation surveillance and monitoring system where a plurality of dosimeters can be spread out over large areas, e.g. airports, warehouses, etc. and communicate to central processing locations.

Because of their small size, sensitivities below the 100 rad range, and stable and enclosed structure, they have medical uses such as implants within a body, e.g. to measure radiation doses (e.g. X-ray, gamma, and proton radiation) within a tumor during treatment.

The descriptions of the various embodiments of the present invention have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A semiconductor dosimeter comprising:
   two vertical field effect transistors (VFETs), each VFET having a bottom first-type doped source/drain, a top first-type doped source/drain, and an undoped channel between each bottom and top first-type doped source drains;
   an implanted charge storage region between and in contact with each of the channels on a charge storage side of the respective channel, a trapped charge within the implanted charge storage region along the charge storage side, an amount of the trapped charge related to a radiation amount that passes through the implanted charge storage region, and the implanted charge storage region having a storage region height along the respective channel and an inter-channel distance between the channels, the implanted charge storage region not being outside either of the undoped channels;
   a bottom spacer layer electrically insulating the implanted charge storage region from the bottom first-type doped source drain;
   a top spacer layer electrically insulating the implanted charge storage region from the top first-type doped source drain;
   a gate dielectric material disposed on each of the channels on a gate channel side, the gate channel side being opposite the charge storage side on the channel; and
   a gate contact electrically connected to each of the gate dielectric materials,
   wherein the amount of trapped charge creates an electric field in each of the channels that varies a threshold voltage of current flow between the bottom and top first-type doped source/drains of each of the VFETs, the threshold voltage being related to the radiation amount.

2. A dosimeter, as in claim 1, where the bottom and top first-type doped source/drains are silicon doped n-typed with one or more of the following: phosphorus and arsenic.

3. A dosimeter, as in claim 1, where the bottom and top first-type doped source/drains are silicon doped p-typed with one or more of the following: boron and gallium.

4. A dosimeter, as in claim 1, where the implanted charge storage region is made of a charge storage region material that is an insulator made of one of the following materials: silicon oxide, Silicon nitride, SiON, Al2O3, BN, and HfO2.

5. A dosimeter, as in claim 1, where the charge storage region material is doped with one or more of the following storage material dopants: ions, oxygen ions, hydrogen ions, H+; argon ions, Ar+; and electrons through high-energy (10-200 keV) electron beams.

6. A dosimeter, as in claim 1, where charge storage region material has a doping level as follows: for hydrogen ions, H+, between 1e13 and 1e17 cm-2 at 40-100 keV; for argon ions, Ar+, between 1e10 and 1e15 cm-2 at 25-200 keV; and for electrons between 1-500 mC at 10-200 keV.

7. A dosimeter, as in claim 1, where a work function metal disposed on the gate dielectric materials of both the gates is electrically connected and surrounds both of the channels around a gate side of the channels where the gate side of channels is across each channels from the charge storage side of the respective channel.

8. A dosimeter, as in claim 1, where the thickness of the charge storage region material is between 20 nm and 500 nm.

9. A dosimeter, as in claim 1, where the inter-channel distance is between 2 nm and 50 nm.

10. A dosimeter, as in claim 1, where an aspect ratio is the storage region height divided by the inter-channel distance and is greater than 5.

11. A semiconductor dosimeter comprising:
    two vertical field effect transistors (VFETs), each VFET having a bottom first-type doped source/drain, a top first-type doped source/drain, and an undoped channel between each bottom and top first-type doped source drains;
    an implanted charge storage region between and in contact with each of the channels on a charge storage side of the respective channel, a trapped charge within the implanted charge storage region along the charge storage side, an amount of the trapped charge related to a radiation amount that passing through the charge storage material, and the implanted charge storage region having a storage region height along the respective channel and an inter-channel distance between the channels, the charge storage material being doped with one or more storage material dopants, the implanted charge storage region not being outside either of the undoped channels;
    a bottom spacer layer electrically insulating the charge storage material from the bottom first-type doped source drain;

a top spacer layer electrically insulating the charge storage material from the top first-type doped source drain;
a gate dielectric material disposed on each of the channels on a gate channel side, the gate channel side being opposite the charge storage side on the channel; and
a gate contact electrically connected to each of the gate dielectric materials,
wherein the amount of trapped charge creates an electric field in each of the channels that varies a threshold voltage of current flow between the bottom and top first-type doped source/drains of each of the VFETs, the threshold voltage being related to the radiation amount and an aspect ratio of the storage region height to the inter-channel distance is between 5 and 10.

12. A dosimeter, as in claim 11, where the gate contacts are electrically connected, the bottom first-type doped source/drains are electrically connected, and the top first-type doped source/drains are electrically connected.

13. A dosimeter, as in claim 11, that can measure radiation doses below 100 rads.

14. A dosimeter, as in claim 11, where the bottom first-type doped source/drain is disposed on a counter-doped layer doped with a second-type dopant.

15. A semiconductor dosimeter, as in claim 11, where the charge storage material is an insulator made of one of the following materials: silicon oxide, silicon nitride, SiON, Al2O3, BN, and HfO2.

16. A dosimeter, as in claim 11, where the charge storage material is doped with one or more of the following storage material dopants: ions, oxygen ions, hydrogen ions, H+; argon ions, Ar+; and electrons through high-energy (10-200 keV) electron beams.

17. A dosimeter, as in claim 11, where the material dopants do not enter the channels.

18. A dosimeter, as in claim 11, where a sensitivity of the dosimeter increases as a concentration of one or more of the material dopants increases.

19. A dosimeter, as in claim 11, where the bottom first-type doped source/drain is disposed on a counter-doped layer and the radiation penetrates only through the counter-doped layer, the bottom first-type doped source/drain, and the bottom spacer layer before passing through the implanted charge storage region.

20. A dosimeter, as in claim 19, where a distance the radiation penetrates is less than 350 nm.

* * * * *